US012772597B2

United States Patent

(12) United States Patent
Tsuchiya et al.

(10) Patent No.: US 12,772,597 B2
(45) Date of Patent: Oct. 20, 2026

(54) PHOTOELECTRIC CONVERSION APPARATUS

(71) Applicant: CANON KABUSHIKI KAISHA, Tokyo (JP)

(72) Inventors: Hiroyuki Tsuchiya, Tokyo (JP); Hiroshi Sekine, Kanagawa (JP); Kazuhiro Morimoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 290 days.

(21) Appl. No.: 18/523,508

(22) Filed: Nov. 29, 2023

(65) Prior Publication Data

US 2024/0178262 A1 May 30, 2024

(30) Foreign Application Priority Data

Nov. 30, 2022 (JP) ................................ 2022-190921

(51) Int. Cl.
*H10F 39/00* (2025.01)

(52) U.S. Cl.
CPC ....... *H10F 39/811* (2025.01); *H10F 39/8033* (2025.01); *H10F 39/8057* (2025.01); *H10F 39/807* (2025.01)

(58) Field of Classification Search
CPC .. H10F 39/18; H10F 39/3033; H10F 39/8057; H10F 39/807; H10F 39/811
See application file for complete search history.

(56) References Cited

U.S. PATENT DOCUMENTS

2010/0282948 A1* 11/2010 Miyajima ............ H10F 30/225 257/E31.037
2018/0090526 A1 3/2018 Mandai
2019/0181177 A1 6/2019 Kobayashi et al.
2019/0252442 A1 8/2019 Tanaka
2020/0015280 A1 1/2020 Fujishiro
2020/0028018 A1 1/2020 Iwata
2020/0152807 A1 5/2020 Röhrer
2020/0249083 A1 8/2020 Ito
2020/0258930 A1 8/2020 Tanaka
2020/0286946 A1 9/2020 Mandai et al.
2022/0005854 A1 1/2022 Inoue
2022/0052083 A1 2/2022 Tsukuda
(Continued)

FOREIGN PATENT DOCUMENTS

JP H10209486 A 8/1998
JP 2019033136 A 2/2019
(Continued)

*Primary Examiner* — Fazli Erdem
(74) *Attorney, Agent, or Firm* — Canon.U.S.A., Inc. IP Division

(57) ABSTRACT

A photoelectric conversion apparatus including an avalanche photodiode is provided. The photoelectric conversion apparatus includes an oxide film disposed on a semiconductor layer and a member provided on the oxide film. The member is disposed to overlap at least a boundary between a first semiconductor region and a third semiconductor region in plan view. The work function of the member differs from the work function of each of the first semiconductor region and the third semiconductor region so that a potential gradient for signal charge is generated in a depth direction of the semiconductor layer at at least the boundary.

19 Claims, 23 Drawing Sheets

(56) References Cited

U.S. PATENT DOCUMENTS

| | | | | |
|---|---|---|---|---|
| 2022/0140156 | A1 | 5/2022 | Yagi | |
| 2022/0163674 | A1 | 5/2022 | Matsumoto | |
| 2023/0090385 | A1 | 3/2023 | Morimoto | |
| 2023/0097091 | A1 | 3/2023 | Morimoto | |
| 2023/0215884 | A1 | 7/2023 | Sekine | |
| 2023/0238405 | A1 | 7/2023 | Shimada | |
| 2023/0384431 | A1 | 11/2023 | Ogi | |
| 2024/0213281 | A1 | 6/2024 | Shimada | |
| 2024/0313022 | A1* | 9/2024 | Shimada | H10F 39/18 |
| 2025/0072140 | A1* | 2/2025 | Kasukawa | H10F 39/8063 |

FOREIGN PATENT DOCUMENTS

| | | | |
|---|---|---|---|
| WO | 2019026719 | A1 | 2/2019 |
| WO | 2020189082 | A1 | 9/2020 |
| WO | 2021187096 | A1 | 9/2021 |

* cited by examiner

PHOTOELECTRIC CONVERSION APPARATUS

BACKGROUND OF THE DISCLOSURE

Field of the Disclosure

The present disclosure relates to a photoelectric conversion apparatus, a photoelectric conversion system, and a mobile object.

Description of the Related Art

U.S. Patent Application Publication No. 2020/0152807 describes a single photon avalanche photodiode (SPAD) having a protective film consisting of an oxide film, a nitride film, or a combination thereof on a silicon substrate surface.

SUMMARY OF THE DISCLOSURE

According to an aspect of the present disclosure, a photoelectric conversion apparatus having an avalanche photodiode is provided. The photoelectric conversion apparatus includes a semiconductor layer having a first surface and a second surface, a first semiconductor region of a first conductivity type disposed at a first depth, a second semiconductor region of a second conductivity type disposed at a second depth that is greater than the first depth from the first surface, wherein the second semiconductor region forms the avalanche photodiode together with the first semiconductor region, a third semiconductor region of the first conductivity type provided in contact with an end portion of the first semiconductor region, an oxide film disposed on the first surface of the semiconductor layer, a member provided on an opposite side of the oxide film from the semiconductor layer in cross-sectional view, wiring, and a contact plug configured to connect the wiring to the first surface of the semiconductor layer, wherein the member is disposed to overlap at least a boundary between the first semiconductor region and the third semiconductor region in plan view, wherein the member is disposed between the wiring and the semiconductor layer, and wherein a work function of the member differs from a work function of each of the first semiconductor region and the third semiconductor region so that a potential gradient for signal charge is generated in a depth direction of the semiconductor layer at at least the boundary.

According to another aspect of the present disclosure, a photoelectric conversion apparatus having an avalanche photodiode is provided. The photoelectric conversion apparatus includes a semiconductor layer having a first surface and a second surface, a first semiconductor region of a first conductivity type disposed at a first depth, a second semiconductor region of a second conductivity type disposed at a second depth that is greater than the first depth from the first surface, wherein the second semiconductor region forms the avalanche photodiode together with the first semiconductor region, a third semiconductor region of the first conductivity type provided in contact with an end portion of the first semiconductor region, an oxide film disposed on the first surface of the semiconductor layer, a protective film disposed on an opposite side of the oxide film from the semiconductor layer, wherein the protective film is made of a material that differs from the material used for the oxide film, an interlayer film disposed on an opposite side of the protective film from the oxide film, and a member provided between the oxide film and the protective film in cross-sectional view, wherein the member is disposed to overlap at least a boundary between the first semiconductor region and the third semiconductor region in plan view.

Further features of the present disclosure will become apparent from the following description of exemplary embodiments with reference to the attached drawings.

DESCRIPTION OF THE EMBODIMENTS

Figure 1:
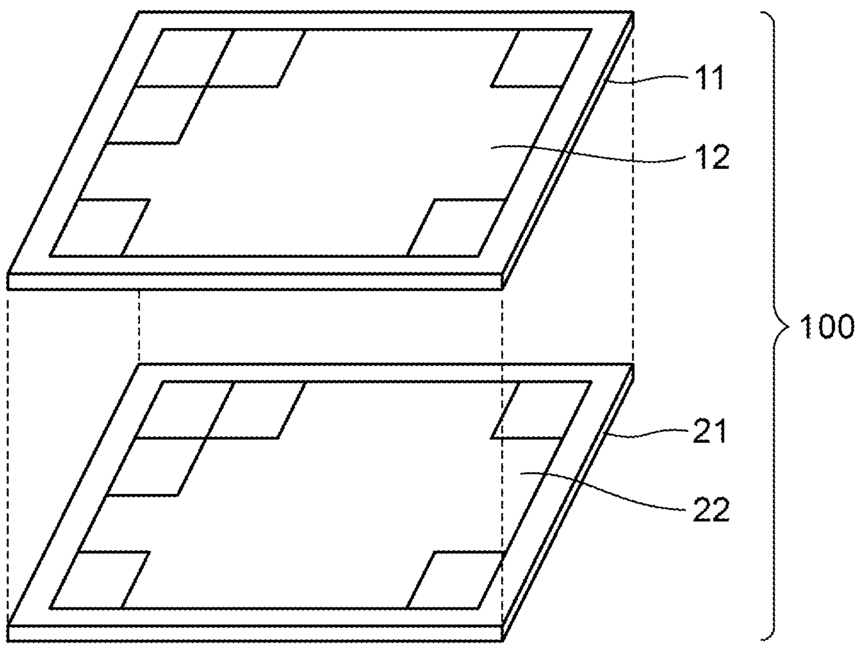
FIG. 1 is a schematic illustration of a photoelectric conversion apparatus according to an embodiment.

In an SPAD, an avalanche multiplication is initiated by applying a strong electric field to a PN junction diode provided in a semiconductor layer to detect photons. However, when the electric field applied to the PN junction diode becomes intense, hot carriers accelerated by the electric field are generated. In the structure described in U.S. Patent Application Publication No. 2020/0152807, hot carriers are trapped near the cathode region, causing the potential to change and, thus, the breakdown voltage to change over time.

Accordingly, the present disclosure provides a structure of a photoelectric conversion apparatus to reduce a temporal change in the breakdown voltage due to an increase in hot carriers over time.

Embodiments described below are for embodying the technical concept of the present disclosure and are not intended to limit the present disclosure. The sizes and positional relationships of members illustrated in the drawings may be exaggerated for clarity of description. In the following description, the same configuration may be identified by the same reference numeral, and description may be omitted.

The embodiments of the present disclosure are described in detail below with reference to the accompanying drawings. In the following description, the terms indicating specific directions and positions (for example, "upper", "lower", "right", "left", and other terms including these terms) are used as necessary. These terms are used to facilitate understanding of the embodiments with reference to the drawings, and the technical scope of the present disclosure is not limited by the meanings of the terms.

As used herein, the term "plan view" is used to refer to a view in a direction perpendicular to the light incident surface of a semiconductor layer. The term "cross-sectional view" refers to a plane in a direction perpendicular to the light incident surface of the semiconductor layer. When the light incident surface of the semiconductor layer is microscopically rough, the plan view is defined on the basis of the light incident surface of the semiconductor layer when viewed macroscopically.

In the following description, the anode of an avalanche photodiode (APD) is set at a fixed electric potential, and a signal is taken from the cathode side. Therefore, a semiconductor region of a first conductivity type in which the charges of a polarity the same as that of a signal charge are majority carriers is an N-type semiconductor region, and a semiconductor region of a second conductivity type in which the charges of the polarity different from that of a signal charge are majority carriers is a P-type semiconductor region.

The present disclosure can also be applied when the cathode of the APD is set at a fixed electric potential and the signal is taken from the anode side. In this case, the semiconductor region of the first conductivity type in which charges of a polarity the same as that of the signal charge are majority carriers is a P-type semiconductor region, and the semiconductor region of the second conductivity type in which charges of a polarity different from that of the signal charge are majority carriers is an N-type semiconductor region. Hereinafter, the case where one of the nodes of the APD is set to a fixed electric potential is described below. However, the potentials of both nodes may vary.

The term "impurity concentration" as simply used herein refers to the net impurity concentration obtained after subtracting the amount compensated by the impurity of an opposite conductivity type. That is, the term "impurity concentration" refers to the NET doping concentration. A region in which the P-type additive impurity concentration is higher than the N-type additive impurity concentration is a P-type semiconductor region. In contrast, a region in which the N-type additive impurity concentration is higher than the P-type additive impurity concentration is an N-type semiconductor region.

A configuration common to all embodiments of a photoelectric conversion apparatus and a method for driving the photoelectric conversion apparatus according to the present disclosure are described below with reference to FIGS. 1 to 4 and FIGS. 5A to 5C.

FIG. 1 illustrates the configuration of a lamination type photoelectric conversion apparatus 100 according to an embodiment of the present disclosure.

The photoelectric conversion apparatus 100 is configured by stacking and electrically connecting a sensor substrate 11 with a circuit substrate 21. The sensor substrate 11 has a first semiconductor layer including photoelectric conversion elements 102 (described below) and a first wiring structure. The circuit substrate 21 has a second semiconductor layer including circuits, such as a signal processing unit 103 (described below), and a second wiring structure. The photoelectric conversion apparatus 100 is configured by stacking the second semiconductor layer, the second wiring structure, the first wiring structure, and the first semiconductor layer in this order. The photoelectric conversion apparatus described in each of the embodiments is a back-illuminated photoelectric conversion apparatus in which light is incident on a first surface and a circuit substrate is disposed on a second surface.

Although the sensor substrate 11 and the circuit substrate 21 in the form of diced chips are described below, the forms are not limited to chips. For example, the substrates may be wafers. In addition, the substrates in the form of wafers may be stacked and then diced or may be made into chips and then stacked and bonded.

The sensor substrate 11 has a pixel region 12 disposed therein, and the circuit substrate 21 has, disposed therein, a circuit region 22 for processing signals detected by the pixel region 12.

Figure 2:
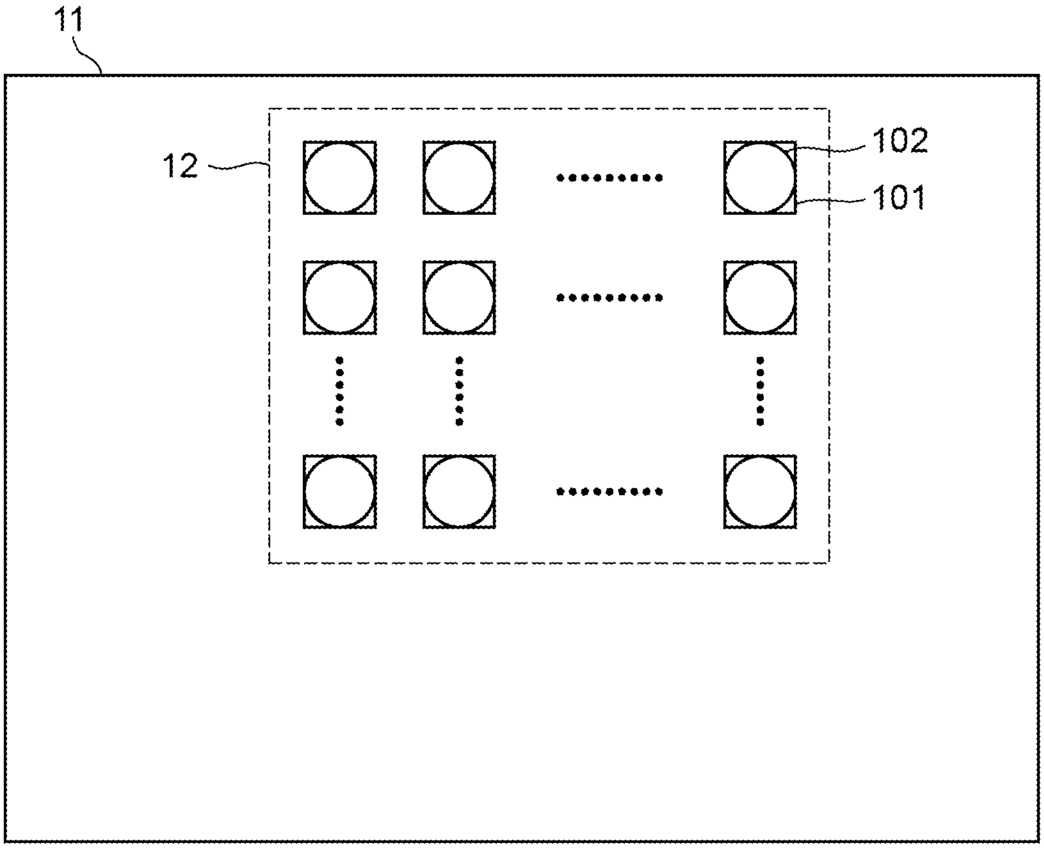
FIG. 2 is a schematic illustration of a PD substrate of the photoelectric conversion apparatus according to the embodiment.

FIG. 2 illustrates an arrangement example in the sensor substrate 11. Pixels 101 each having a photoelectric conversion element 102 including an avalanche photodiode (APD) are arranged in a two-dimensional array in plan view to form the pixel region 12.

The pixels 101 are typically pixels for forming an image. However, when used for TOF (Time of Flight), the pixels 101 do not necessarily form an image. That is, the pixels 101 may be pixels for measuring the time and the amount of light when the light reaches the pixels 101.

Figure 3:
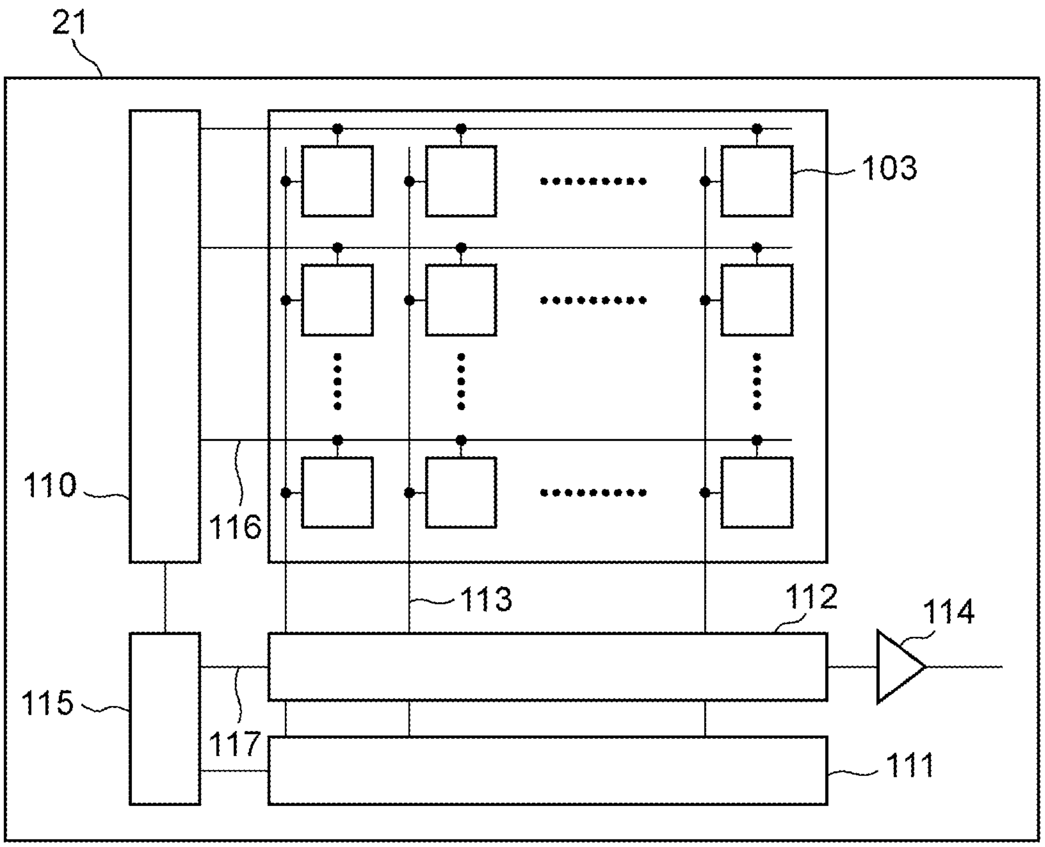
FIG. 3 is a schematic illustration of a circuit substrate of the photoelectric conversion apparatus according to the embodiment.

FIG. 3 is a configuration diagram of the circuit substrate 21. The circuit substrate 21 includes the signal processing units 103 that process charges photoelectrically converted by the photoelectric conversion elements 102 illustrated in FIG. 2, a column circuit 112, a control pulse generation circuit 115, a horizontal scanning circuit unit 111, a signal lines 113, and a vertical scanning circuit unit 110.

The photoelectric conversion element 102 illustrated in FIG. 2 and the signal processing unit 103 illustrated in FIG. 3 are electrically connected via a connection conductive line provided for each of the pixels.

The vertical scanning circuit unit 110 receives a control pulse supplied from the control pulse generation unit 115 and supplies the control pulse to each of the pixels. Logic circuits, such as a shift register and an address decoder, are used in the vertical scanning circuit unit 110.

A signal output from the photoelectric conversion element 102 of the pixel is processed by the signal processing unit

103. The signal processing unit 103 includes a counter, a memory, and the like, and a digital value is held in the memory.

The horizontal scanning circuit unit 111 inputs a control pulse for sequentially selecting each of columns to the signal processing unit 103 to read a signal from the memory of each of the pixels that holds the digital signal.

The signal is output to the signal line 113 from the signal processing unit 103 of the pixel selected by the vertical scanning circuit unit 110 for the selected column.

The signal output to the signal line 113 is output to an external recording unit or the signal processing unit of the photoelectric conversion apparatus 100 via an output circuit 114.

In FIG. 2, the array of photoelectric conversion elements in the pixel region may be a one-dimensional array. In addition, the effect of the present disclosure can be obtained even if there is one pixel, and the present disclosure also includes the case where there is one pixel. The function of the signal processing unit does not necessarily have to be provided for each of the photoelectric conversion elements. For example, one signal processing unit may be shared by a plurality of photoelectric conversion elements, and signal processing may be performed sequentially.

As illustrated in FIGS. 2 and 3, a plurality of signal processing units 103 are arranged in a region that overlaps the pixel region 12 in plan view. The vertical scanning circuit unit 110, the horizontal scanning circuit unit 111, the column circuit 112, the output circuit 114, and the control pulse generation unit 115 are arranged so as to overlap a region between the edges of the sensor substrate 11 and the edge of the pixel region 12 in plan view. That is, the sensor substrate 11 has the pixel region 12 and a non-pixel region disposed surrounding the pixel region 12, and the vertical scanning circuit unit 110, the horizontal scanning circuit unit 111, the column circuit 112, the output circuit 114, and the control pulse generation unit 115 are arranged in the region that overlaps the non-pixel region in plan view.

Figure 4:
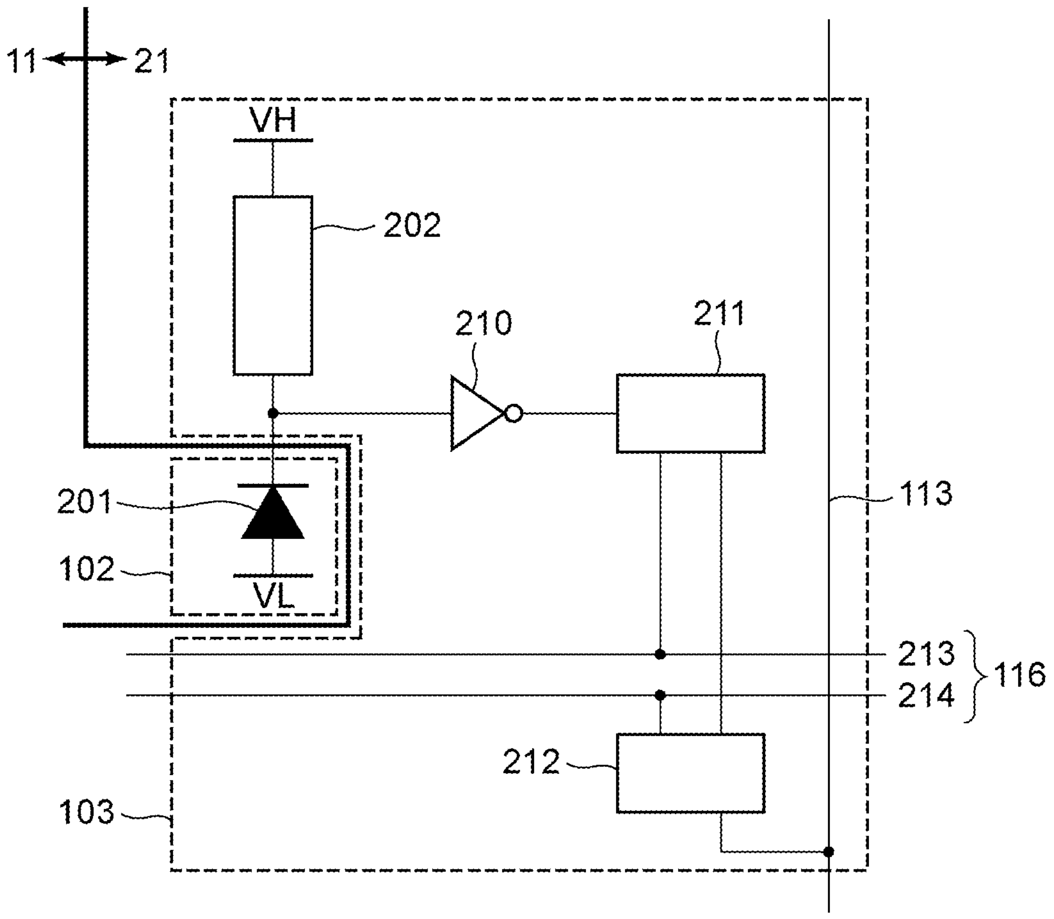
FIG. 4 illustrates an example configuration of a pixel circuit of the photoelectric conversion apparatus according to the embodiment.

FIG. 4 is an example of a block diagram including the equivalent circuit of the configuration illustrated in FIGS. 2 and 3.

In FIG. 2, the photoelectric conversion element 102 including an APD 201 is provided in the sensor substrate 11, and the other members are provided in the circuit substrate 21.

The APD 201 generates charge pairs in accordance with incident light by photoelectric conversion. A voltage VL (a first voltage) is supplied to the anode of the APD 201. In addition, a voltage VH (a second voltage) that is higher than the voltage VL supplied to the anode is supplied to the cathode of the APD 201. A reverse bias voltage is supplied to the anode and cathode so that the APD 201 performs an avalanche multiplication operation. By supplying such voltages, charges generated by the incident light undergo avalanche multiplication, which generates an avalanche current.

When a reverse bias voltage is supplied, an APD has two modes of operation: the Geiger mode in which the potential difference between the anode and cathode is greater than the breakdown voltage and the linear mode in which the potential difference between the anode and cathode is less than or equal to the breakdown voltage.

An APD operated in the Geiger mode is referred to as an SPAD. For example, the voltage VL (the first voltage) is −30 V, and the voltage VH (the second voltage) is 1 V. The APD 201 may be operated in either the linear mode or the Geiger mode.

A quenching element 202 is connected to a power source that supplies the voltage VH and the APD 201. The quenching element 202 functions as a load circuit (a quenching circuit) during signal multiplication by avalanche multiplication, reduces the voltage supplied to the APD 201, and has a function of reducing avalanche multiplication (a quenching operation). In addition, the quenching element 202 has a function of causing a current corresponding to the voltage drop due to the quenching operation to flow and returning the voltage supplied to the APD 201 to the voltage VH (a recharge operation).

The signal processing unit 103 includes a waveform shaping unit 210, a counter circuit 211, and a selection circuit 212. Herein, the signal processing unit 103 can include any one of the waveform shaping unit 210, the counter circuit 211, and the selection circuit 212.

The waveform shaping unit 210 shapes a change in the potential of the cathode of the APD 201 obtained during photon detection and outputs a pulse signal. For example, an inverter circuit is used as the waveform shaping unit 210. Although FIG. 4 illustrates an example in which one inverter is used as the waveform shaping unit 210, a circuit in which a plurality of inverters are connected in series may be used, or another circuit having a waveform shaping effect may be used.

The counter circuit 211 counts the pulse signals output from the waveform shaping unit 210 and holds a count value. Furthermore, when a control pulse pRES is supplied via a drive line 213, a count value held in the counter circuit 211 is reset.

The selection circuit 212 is supplied with a control pulse pSEL from the vertical scanning circuit unit 110 illustrated in FIG. 3 via a drive line 214 illustrated in FIG. 4 (not illustrated in FIG. 3) and switches between connection and disconnection of the counter circuit 211 from the signal line 113. The selection circuit 212 includes, for example, a buffer circuit for outputting a signal.

A switch, such as a transistor, may be provided between the quenching element 202 and the APD 201 or between the photoelectric conversion element 102 and the signal processing unit 103 to switch the electrical connection. Similarly, the voltage VH and the voltage VL supplied to the photoelectric conversion element 102 may be electrically switched using a switch, such as a transistor.

According to the present embodiment, the configuration using the counter circuit 211 is described. However, the photoelectric conversion apparatus 100 that acquires the pulse detection timing may be achieved by using a time-to-digital converter (hereinafter referred to as a TDC) and a memory instead of the counter circuit 211. At this time, the generation timing of the pulse signal output from the waveform shaping unit 210 is converted into a digital signal by the TDC. To measure the timing of the pulse signal, the TDC receives a control pulse pREF (a reference signal) supplied thereto from the vertical scanning circuit unit 110 illustrated in FIG. 3 via the drive line. The TDC acquires a signal in the form of a digital signal when the input timing of the signal output from each of the pixels via the waveform shaping unit 210 is regarded as a time relative to the control pulse PREF.

Figure 5A:
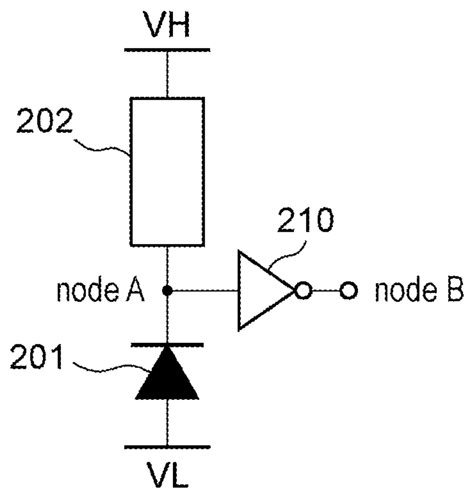
FIGS. 5A to 5C are schematic illustrations of driving of the pixel circuit of the photoelectric conversion apparatus according to the embodiment.
Figure 5B:
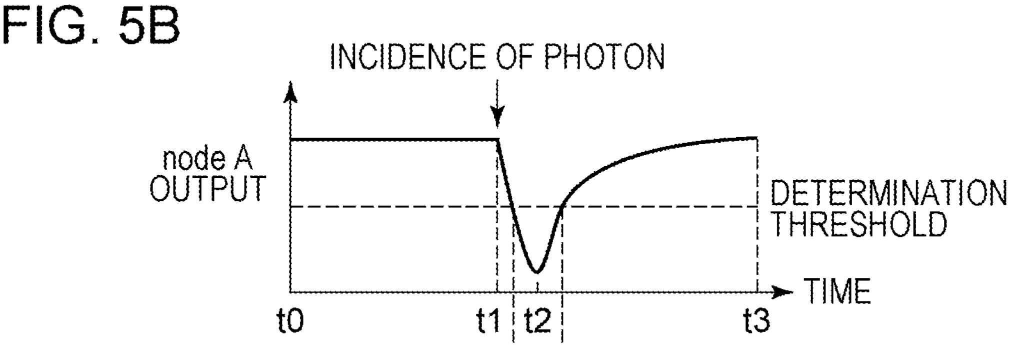
Figure 5C:
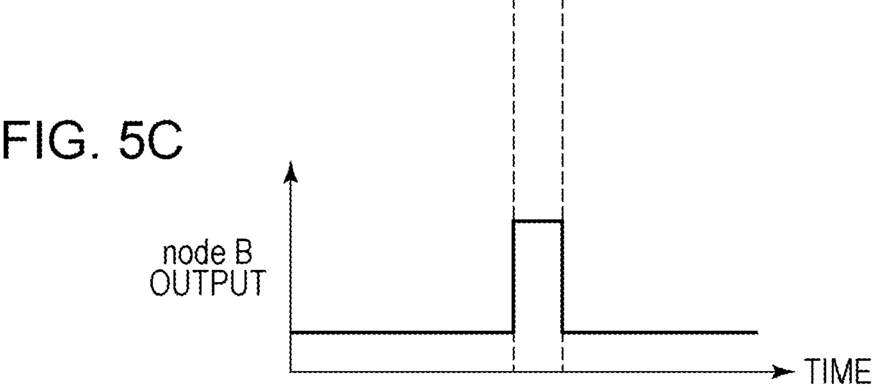

FIGS. 5A to 5C are schematic illustrations of the relationship between the operation performed by the APD and the output signals.

FIG. 5A illustrates the APD 201, the quenching element 202, and the waveform shaping unit 210 illustrated in FIG. 4. In FIG. 5A, let node A be the input side of the waveform shaping unit 210, and let node B be the output side of the waveform shaping unit 210. Then, FIG. 5B illustrates a change in the waveform in the node A illustrated in FIG. 5A, and FIG. 5C illustrates a change in the waveform in the node B illustrated in FIG. 5A.

Between time t0 and time t1, a potential difference of (VH−VL) is applied to the APD 201 illustrated in FIG. 5A. When a photon is incident on the APD 201 at time t1, avalanche multiplication occurs in the APD 201, an avalanche multiplication current flows through the quenching element 202, and the voltage in the node A drops. When the voltage drop amount further increases and the potential difference applied to the APD 201 decreases, the avalanche multiplication in the APD 201 stops at time t2, and the voltage level of the node A does not drop beyond a certain value. Thereafter, between time t2 to time t3, a current that compensates for the voltage drop from the voltage VL flows through the node A. After time t3, the node A remains at the original potential level. At this time, a portion of the output waveform in the node A exceeding a certain threshold is waveform-shaped by the waveform shaping unit 210 and is output as a signal in the node B.

It should be noted that the arrangement of the signal lines 113 and the arrangement of the column circuit 112 and the output circuit 114 are not limited to those illustrated in FIG. 3. For example, the signal lines 113 may be arranged extending in the row direction, and the column circuit 112 may be disposed at the end of the signal line 113 in the extending direction.

A photoelectric conversion apparatus according to each of the embodiments is described below.

First Embodiment

A photoelectric conversion apparatus according to the first embodiment is described below with reference to FIGS. 6 to 12 and FIGS. 13A and 13B.

Figure 6:
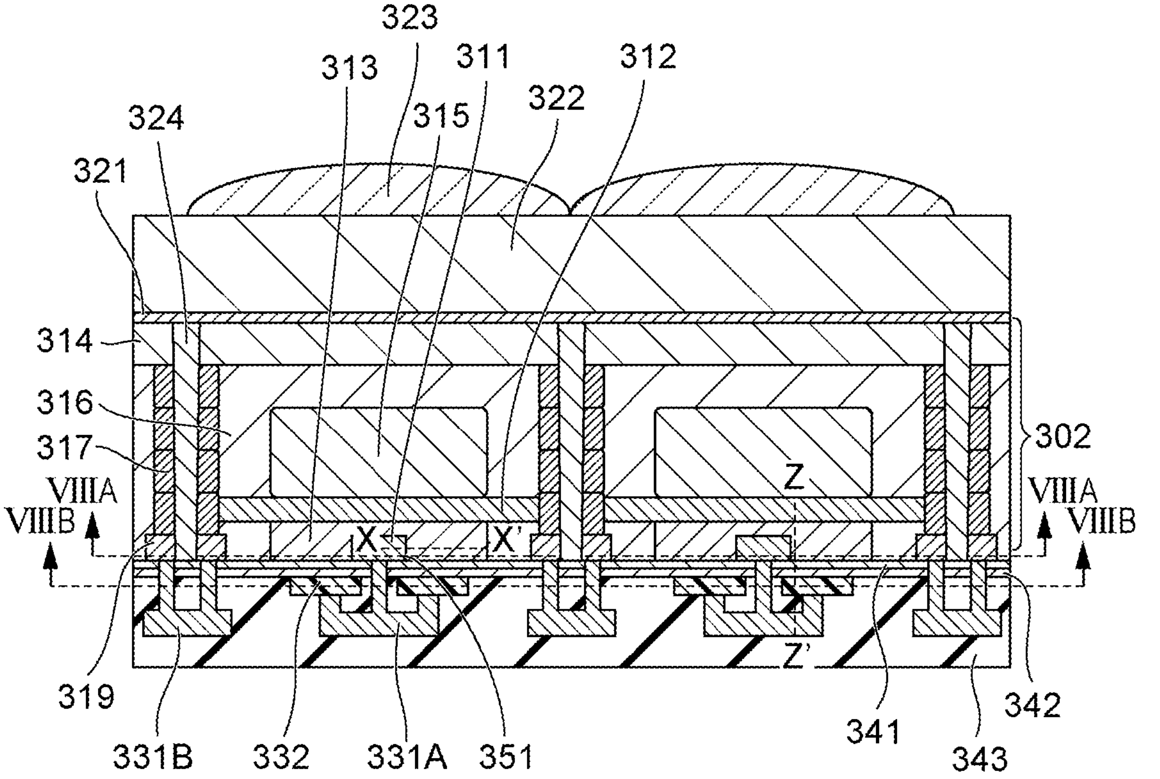
FIG. 6 is a cross-sectional view of a photoelectric conversion element according to a first embodiment.

FIG. 6 is a cross-sectional view of the photoelectric conversion apparatus including two photoelectric conversion elements 102.

The structure and function of the photoelectric conversion element 102 are described below. The photoelectric conversion element 102 has an N-type (first conductivity type) first semiconductor region 311, a third semiconductor region 313, a fifth semiconductor region 315, and a sixth semiconductor region 316. Furthermore, the photoelectric conversion element 102 has a P-type (second conductivity type) second semiconductor region 312, a fourth semiconductor region 314, a seventh semiconductor region 317, and a ninth semiconductor region 319.

According to the present embodiment, in the cross-sectional view illustrated in FIG. 6, the N-type first semiconductor region 311 is formed adjacent to the surface opposite the light incident surface, and the N-type third semiconductor region 313 is formed at an end portion of the first semiconductor region 311. The P-type second semiconductor region 312 is formed at a position overlapping the first semiconductor region 311 and the third semiconductor region 313 in plan view. The N-type fifth semiconductor region 315 is further disposed at a position overlapping the second semiconductor region 312 in plan view, and the N-type sixth semiconductor region 316 is formed around the N-type fifth semiconductor region 315.

The impurity concentration of the first semiconductor region 311 is higher than that of each of the third semiconductor region 313 and the fifth semiconductor region 315. A PN junction is formed between the P-type second semiconductor region 312 and the N-type first semiconductor region 311, and an APD is formed. By making the impurity concentration of the second semiconductor region 312 lower than that of the first semiconductor region 311, the entire portion of the second semiconductor region 312 that overlaps the center of the first semiconductor region in plan view is turned into a depletion layer region. At this time, the potential difference between the first semiconductor region 311 and the second semiconductor region 312 is greater than the potential difference between the second semiconductor region 312 and the fifth semiconductor region 315. The depletion layer region extends to a part of the first semiconductor region 311, and a strong electric field is induced in the extended depletion layer region. The strong electric field causes avalanche multiplication in the depletion layer region extending to the part of the first semiconductor region 311, and an electric current based on the amplified charge is output as signal charge. When light incident on the photoelectric conversion element 102 is photoelectrically converted and avalanche multiplication occurs in the depletion layer region (an avalanche multiplication region), the generated charge of the first conductivity type is collected in the first semiconductor region 311.

Although in FIG. 6, the third semiconductor region 313 and the fifth semiconductor region 315 are formed to have approximately the same size, the size of each of the semiconductor regions is not limited thereto. For example, the fifth semiconductor region 315 may be formed larger than the third semiconductor region 313 to collect charge from a wider area into the first semiconductor region 311.

The pixels are separated by a pixel separation portion 324 having a trench structure. In addition, the P-type seventh semiconductor region 317 is provided around the pixel separation portion 324, and adjacent photoelectric conversion elements are separated from each other by a potential gradient. Since the photoelectric conversion elements are also separated by the potential of the seventh semiconductor region 317, a trench structure such as the pixel separation portion 324 is not essential as a pixel separation portion. Even when the pixel separation portion 324 having the trench structure is provided, the depth and position of the trench structure are not limited to those in the configuration illustrated in FIG. 6. That is, the pixel separation portion 324 may be DTI (deep trench isolation) that penetrates the semiconductor layer or may be DTI that does not penetrate the semiconductor layer. A material filling the trench structure may be SiO, a fixed charge film, a metal member, Poly-Si, or any combination thereof. A metal may be embedded in the trench structure to improve the light shielding performance. The pixel separation portions 324 may be provided so as to surround the entire circumference of the photoelectric conversion element in plan view. Alternatively, the pixel separation portions 324 may be provided on only the opposite sides of the photoelectric conversion element. If a metal, polysilicon, or the like is embedded in the trench structure, a voltage may be applied to the metal, polysilicon, or the like to induce a charge at the trench interface and reduce DCR (Dark Current Rate).

A pinning film 321, a planarization film 322, and a microlens 323 are formed adjacent to the light incident surface of the semiconductor layer 302.

A concavo-convex structure (not illustrated) by a trench may be provided adjacent to the light incident surface. The concavo-convex structure is surrounded by a P-type fourth semiconductor region 314 and scatters light incident on the photoelectric conversion element 102. Since the incident light travels diagonally inside the photoelectric conversion element, an optical path length that is greater than or equal to the thickness of the semiconductor layer 302 can be ensured, enabling photoelectric conversion of light with a longer wavelength than in the case without the concavo-convex structure. In addition, the concavo-convex structure prevents the reflection of incident light within the substrate, which has the effect of improving the photoelectric conversion efficiency for the incident light.

The fifth semiconductor region 315 and the concavo-convex structure are formed so as to overlap in plan view. The area of a portion of the fifth semiconductor region 315 that overlaps the concavo-convex structure in plan view is greater than the area of a portion of the fifth semiconductor region 315 that does not overlap the concavo-convex structure. Charges generated at a position away from the avalanche multiplication region formed between the first semiconductor region 311 and the fifth semiconductor region 315 have a longer travel time to reach the avalanche multiplication region than charges generated at a position closer to the avalanche multiplication region. Therefore, timing jitter may increase. By placing the fifth semiconductor region 315 and the concavo-convex structure so as to overlap in plan view, the collection time for charges generated at positions away from the avalanche multiplication region can be reduced, which reduces the timing jitter. The fourth semiconductor region 314 three-dimensionally covers the concavo-convex structure, which reduces the generation of thermally excited charge at the interface portion of the concavo-convex structure. As a result, the DCR of the photoelectric conversion element is reduced.

Furthermore, a filter layer (not illustrated) or the like may be disposed adjacent to the light incident surface. As the filter layer, an optical filter, such as a color filter, an infrared cut filter, or a monochrome filter, can be used. As the color filter, an RGB color filter, an RGBW color filter, or the like can be used.

The wiring structure including a conductor and an insulating film is provided on the surface opposite the light incident surface of the semiconductor layer. An interlayer film (an interlayer insulating film) 343 is provided between the wiring provided in the wiring layer and the semiconductor layer. Between the interlayer film 343 and the semiconductor layer, an oxide film 341 and a protective film 342 are provided from the side adjacent to the semiconductor layer. The oxide film 341 and the protective film 342 are films provided over the plurality of pixels. The oxide film 341 is made of, for example, silicon oxide (SiO). However, SiON and the like may be used. The protective film 342 is a dielectric film and is made of a different material than the oxide film 341. The protective film 342 functions as a film to protect the avalanche photodiode from plasma damage and metal contamination during etching. A silicon nitride (SiN) film, which is a nitride film, is widely used as the protective film 342. However, a silicon oxynitride (SiON) film, a silicon carbide (SiC) film, a silicon carbonitride (SiCN) film, or another film may be used. If nitrogen is contained in both the oxide film 341 and the protective film 342, the film having higher nitrogen content is used as the protective film.

As used herein, the term "silicon nitride" refers to a compound of nitrogen (N) and silicon (Si) in which nitrogen (N) and silicon (Si) are elements other than light elements that make up the top two composition ratios of the constituent elements of the compound. Silicon nitride can contain light elements, such as hydrogen (H) and helium (He), the amount (atomic percent) of which may be more or less than each of nitrogen (N) and silicon (Si). Silicon nitride can contain elements other than nitrogen (N), silicon (Si), and light elements in lower concentrations than each of nitrogen (N) and silicon (Si). Typical elements that can be contained in silicon nitride are boron (B), carbon (C), oxygen (O), fluorine (F), phosphorus (P), chlorine (Cl), and argon (Ar). If, among the constituent elements of silicon nitride, the third most abundant element other than a light element is oxygen, the silicon nitride can be referred to as "silicon oxide nitride" or "oxygen-containing silicon nitride".

Similarly, the term "silicon oxide" refers to a compound of oxygen (O) and silicon (Si) in which oxygen (O) and silicon (Si) are elements other than light elements that make up the top two composition ratios of the constituent elements of the compound. Typical elements that can be contained in silicon oxide are hydrogen (H), helium (He), boron (B), carbon (C), nitrogen (N), fluorine (F), phosphorus (P), chlorine (Cl), and argon (Ar). If, among the constituent elements of silicon oxide, the third most abundant element other than a light element is nitrogen, the silicon oxide can be referred to as "silicon nitride oxide" or "nitrogen-containing silicon oxide". The elements contained in each of the constituent members of the photoelectric conversion apparatus can be analyzed by, for example, the energy dispersive X-ray spectrometry (EDX). The hydrogen content can be analyzed by, for example, the elastic recoil detection analysis (ERDA).

Cathode wiring 331A is electrically connected to the first semiconductor region 311 and supplies potential to the first semiconductor region 311. Anode wiring 331B supplies potential to the seventh semiconductor region 317 via the ninth semiconductor region 319. The wiring portions that constitute the cathode wiring 331A and the anode wiring 331B are composed of conductors including metals such as Cu and Al, for example. The anode wiring 331B is referred to as a "first wiring portion", and the cathode wiring 331A is referred to as a "second wiring portion". Depending on context, the wiring located in the first layer of the wiring layer is also referred to as "cathode wiring 331A" or "anode wiring 331B". In this case, the contact portion that is in direct contact with the semiconductor layer, the cathode wiring 331A, and anode wiring 331B may be distinguished from one another, and description may be made. In another case, the entire wiring portion that supplies a voltage to the semiconductor region is also referred to as "cathode wiring 331A and anode wiring 331B". In this case, the contact portion is included in the cathode wiring 331A and anode wiring 331B.

A member 332 is electrically connected to the cathode wiring 331A and is supplied with the same potential as the cathode wiring 331A. The member 332 is located between the cathode wiring 331A provided in a first wiring layer (M1) and the semiconductor layer 302 in cross-sectional view. In FIG. 6, only the first wiring layer, a contact portion that connects the first wiring layer to the semiconductor layer, and a contact portion that connects the first wiring layer to the member 332 are illustrated in the wiring structure. However, in addition to the first wiring layer, a plurality of wiring layers (for example, a second wiring layer and a third wiring layer) may be provided as appropriate. An interlayer film 343 is provided between the first and second wiring layers, and another interlayer film 343 (not illustrated) is provided between the second and third wiring layers. The interlayer film between the semiconductor layer and the first wiring layer is also referred to as a "first interlayer film", and the interlayer film between the first wiring layer and the second wiring layer is also referred to as a "second interlayer film".

Figure 7A:
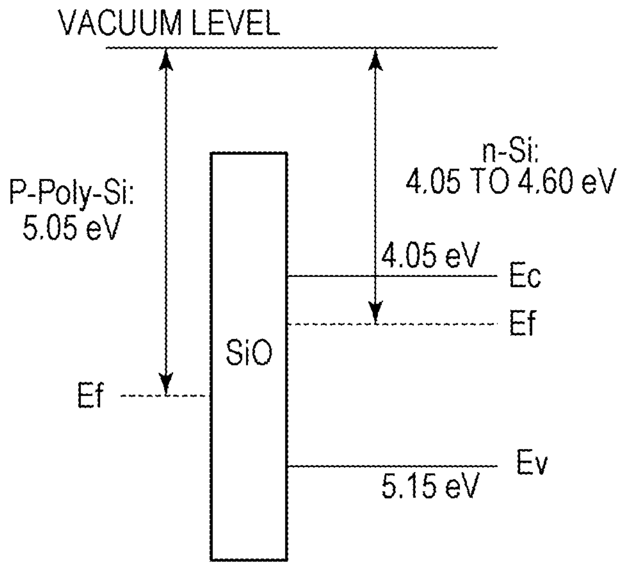
FIGS. 7A and 7B illustrate the work functions according to the first embodiment.
Figure 7B:
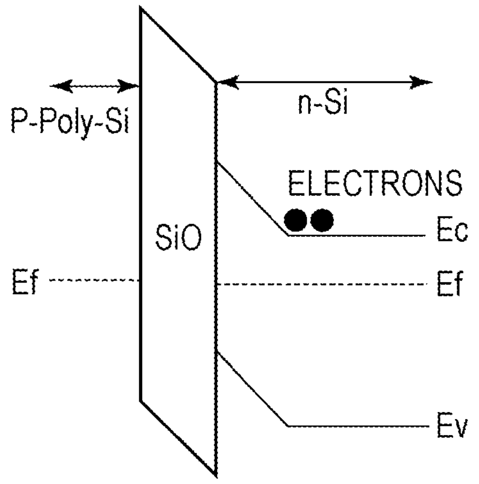

The member 332 is, for example, a member having a work function greater than the work function of each of the first semiconductor region 311 and the third semiconductor region 313 of the first conductivity type when the first conductivity type is N-type. For example, the member 332 is P-type polysilicon. FIGS. 7A and 7B illustrate a work function difference between N-type silicon and P-type polysilicon that are in close proximity. The value of the work function of N-type silicon is generally between 4.6 eV, which is the Fermi energy of true silicon, and 4.05 eV, which is the energy at the lower end of the conduction band. In contrast, the value of the work function of P-type polysilicon is around 5.05 eV, for example, depending on the doping level. Therefore, the work function difference between N-type silicon and P-type polysilicon occurs, and a potential gradient is formed in the depth direction for electrons, which are the signal charges, as illustrated in FIG. 7B.

When the first conductivity type is P-type, the work function of the member 332 is required to be less than that of each of the first semiconductor region 311 of the first conductivity type and the third semiconductor region 313 of the first conductivity type. In this case, a potential gradient is formed in the depth direction for holes, which are the signal charges. For example, N-type polysilicon can be used as the member 332.

That is, the work function of each of the first and third semiconductor regions 311 and 313 differs from the work function of the member 332, so that a potential gradient for the signal charge is formed in the depth direction of the semiconductor layer at least at the boundary.

Figure 8A:
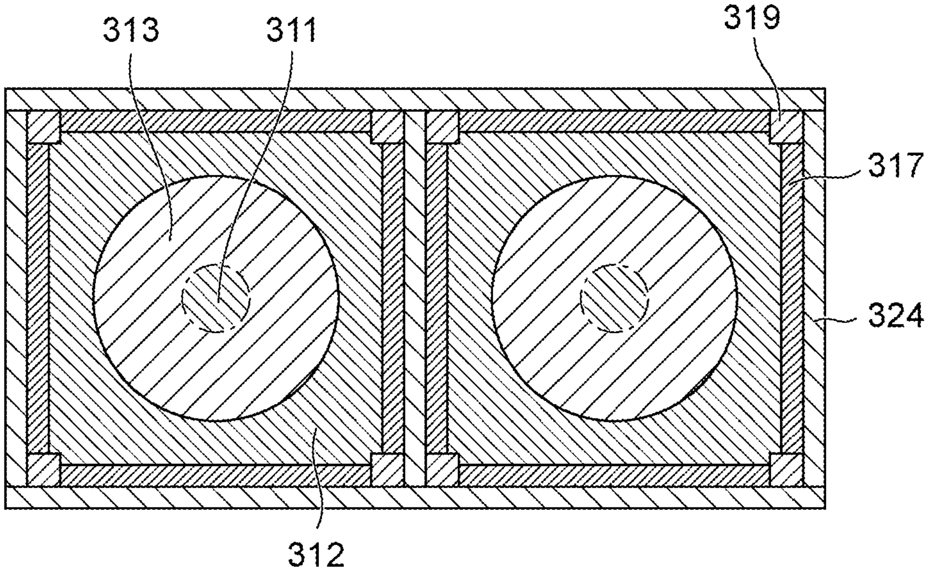
FIGS. 8A and 8B are plan views of the photoelectric conversion element according to the first embodiment.
Figure 8B:
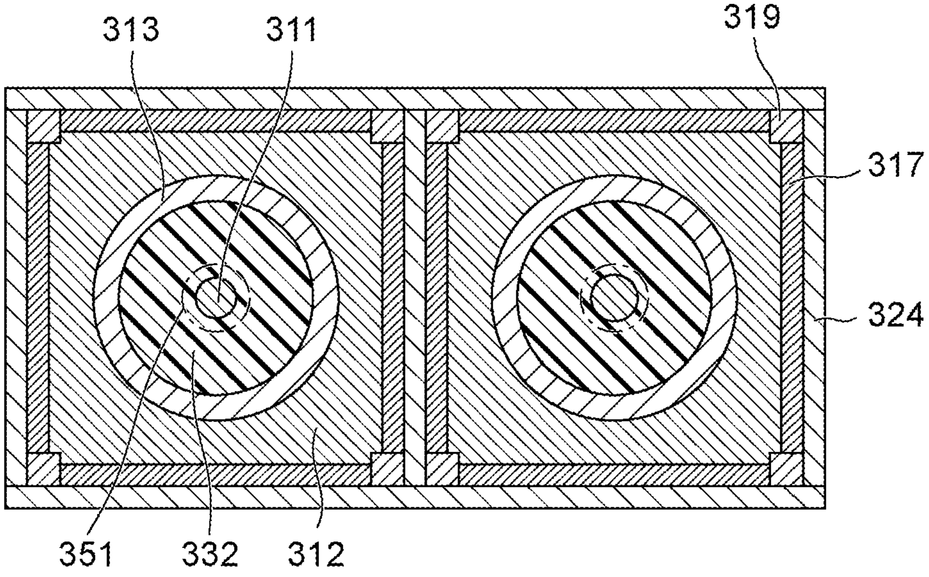

FIG. 8A is a plan view of one pixel between VIIIA and VIIIA in FIG. 6. FIG. 8B is a plan view between VIIIB and VIIIB where the member 332 is located. As illustrated in FIG. 8B, the member 332 overlaps a boundary portion 351 of the first semiconductor region 311 and the third semiconductor region 313 in plan view. This configuration can reduce trapping of hot carriers at the interface in the vicinity of the boundary portion 351. In plan view, the outer edge of the member 332 is included within one pixel, and the member 332 is not provided over two or more pixels.

Figures 9A, 9B, 9C, 9D:
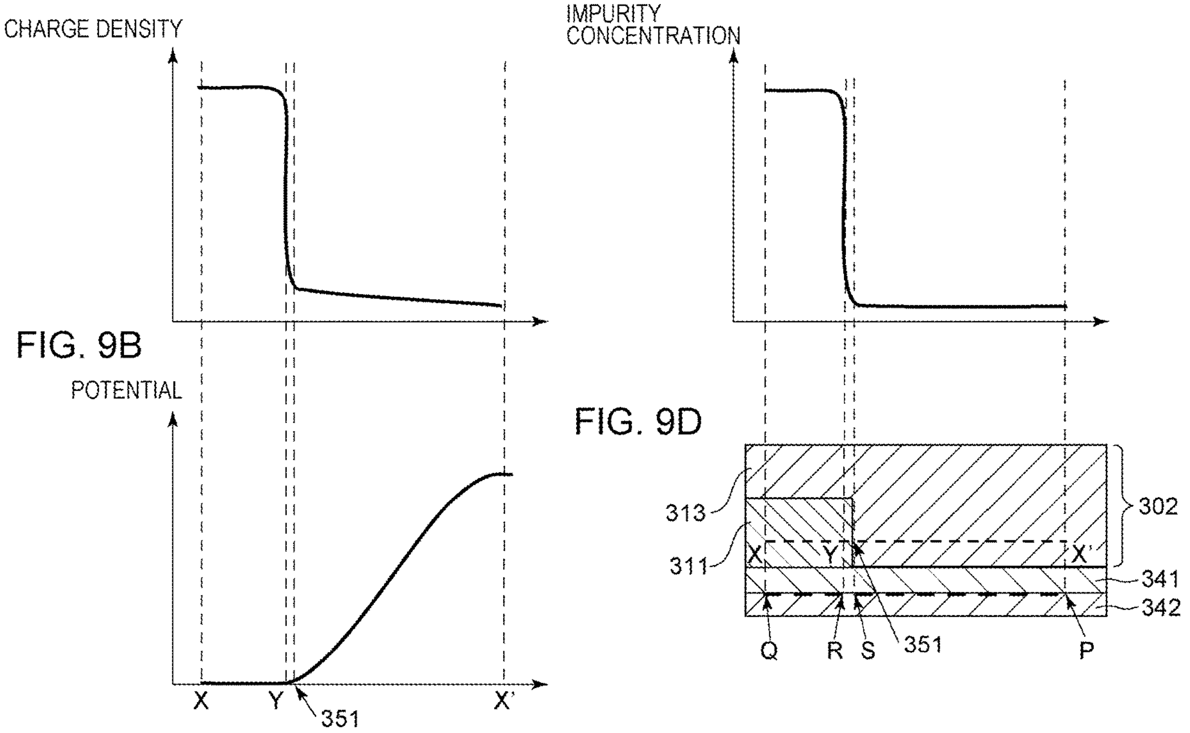
FIGS. 9A to 9D illustrate the charge density, potential distribution, and impurity concentration according to the first embodiment.

FIGS. 9A to 9C illustrate the charge density, potential, and impurity concentration along line X-X' in FIG. 6, respectively. FIG. 9D is an enlarged view of an area in the vicinity of the first semiconductor region 311 along line X-X'. As illustrated in FIG. 9D, the above-described boundary portion 351 is a zone where the potential is low and the charge density is low for electrons (signal charges). As an example of impurity concentration, when the impurity concentration at X is $1\times10^{19}$ $cm^{-3}$, the impurity concentration of the boundary portion 351 is $1\times10^{18}$ $cm^{-3}$. The hot carriers generated by the strong electric field around the first semiconductor region 311 are trapped at, for example, the interface between the oxide film 341 and the protective film 342, and many hot carriers are trapped between Q and S, where the potential is low. When the hot carriers are trapped between Q and R, the charge density in the first semiconductor region 311 between X and Y is high, and the first semiconductor region 311 is a neutral region, so that no electric flux lines are generated. In contrast, when the hot carriers are trapped between R and S, the charge density between Y and the boundary portion 351 is lower than the charge density between X and Y and, thus, the region is a depletion region which is a location susceptible to the effects of charge trapping. Since among the locations between Y and the boundary portion 351, the boundary portion 351 has the lowest charge density, trapping of the hot carriers that occurs at the interface of the boundary portion 351 needs to be reduced. Between the boundary portion 351 and X', the potential increases toward X' and, therefore, the hot carriers are less likely to be trapped between S and P.

Figure 10A:
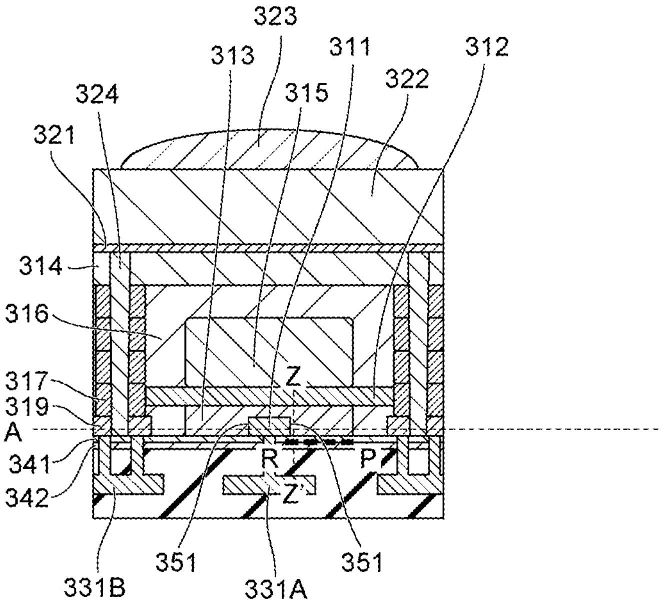
FIGS. 10A and 10B are comparative cross-sectional views of a pixel according to the first embodiment.
Figure 10B:
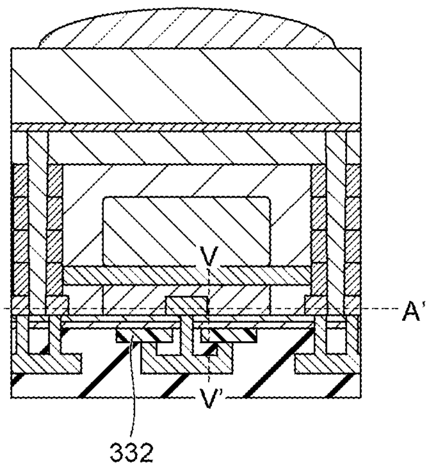

FIG. 10A is a cross-sectional view of one pixel without the member 332 placed, unlike FIG. 6. FIG. 10B is a cross-sectional view of one pixel with the member 332 placed. It is assumed that hot carriers generated by the strong electric field around the first semiconductor region 311 are trapped at, for example, the interface between the oxide film 341 and the protective film 342. In this case, if hot carriers are trapped between R and P, the potential distribution in the avalanche region in the semiconductor layer 302 is likely to be affected, which may change the breakdown voltage.

Figure 11:
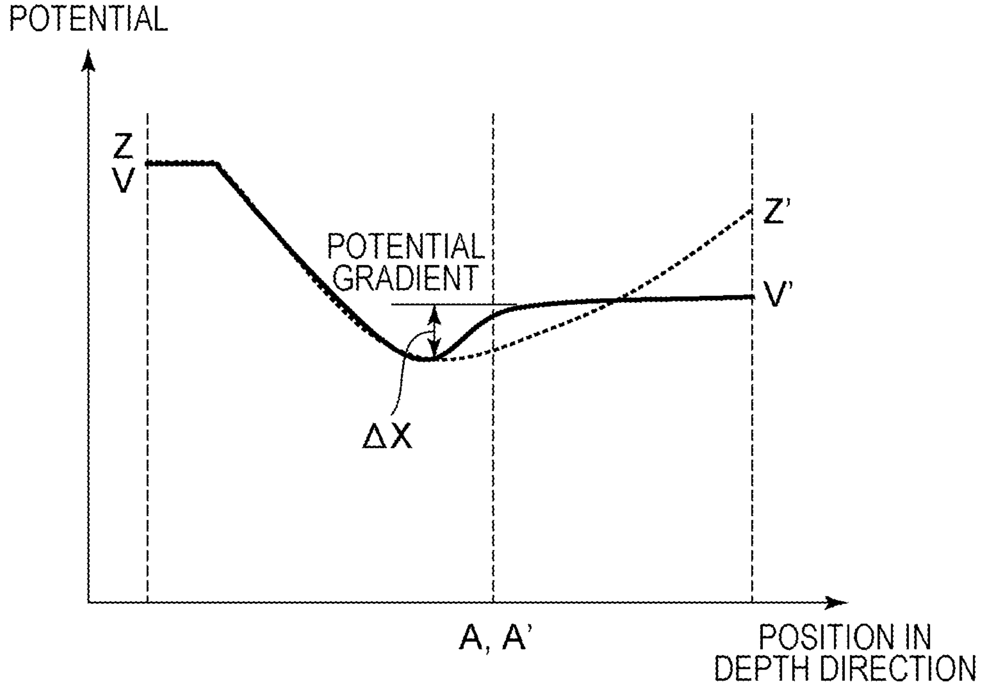
FIG. 11 illustrates the potential distribution of the photoelectric conversion element according to the first embodiment.

FIG. 11 illustrates the potential distribution between Z and Z' in FIG. 10A and the potential distribution between V and V' in FIG. 10B. Unlike FIG. 10A, in FIG. 10B, a potential gradient of ΔX is generated between Z and A. The hot carriers are less likely to be trapped at the interface between the oxide film 341 and the protective film 342 near the boundary portion 351 due to the potential gradient. As a result, the probability of a change in breakdown voltage is reduced.

To avoid hot carrier trapping, the anode wiring can be extended so as to be disposed in a region where the anode wiring overlaps the first semiconductor region 311 and the third semiconductor region 313 in plan view. However, if the distance between the anode wiring and cathode wiring is too short, breakdown voltage concerns may arise. According to the configuration of the present embodiment, since the member 332 is disposed, the distance between the cathode wiring 331A and the anode wiring 331B can be sufficiently maintained to reduce hot carrier trapping, and the breakdown voltage concerns can also be reduced.

Modifications

Figure 12:
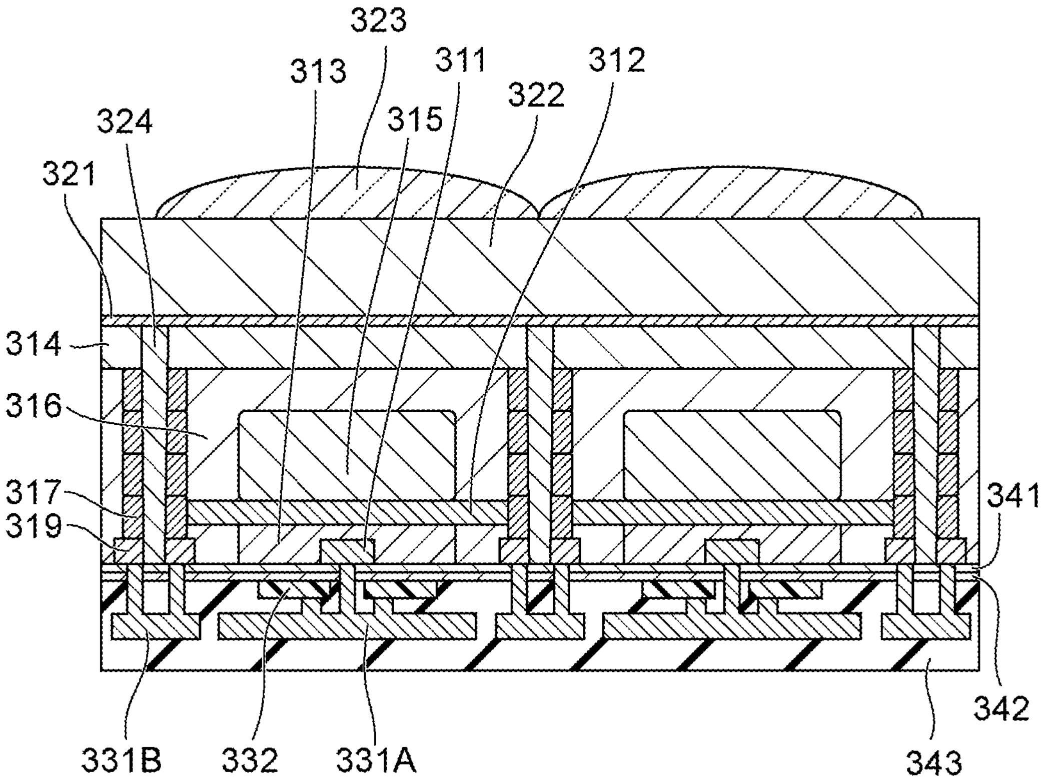
FIG. 12 illustrates Modification 1 of the first embodiment.

FIG. 12 illustrates Modification 1. As illustrated in FIG. 12, a configuration in which the cathode wiring 331A is extended toward the anode wiring 331B may be employed. According to the configuration, the incident light that has passed through the microlens 323 is reflected by the cathode wiring, which improves the sensitivity and reduces a temporal change in breakdown voltage.

Figure 13A:
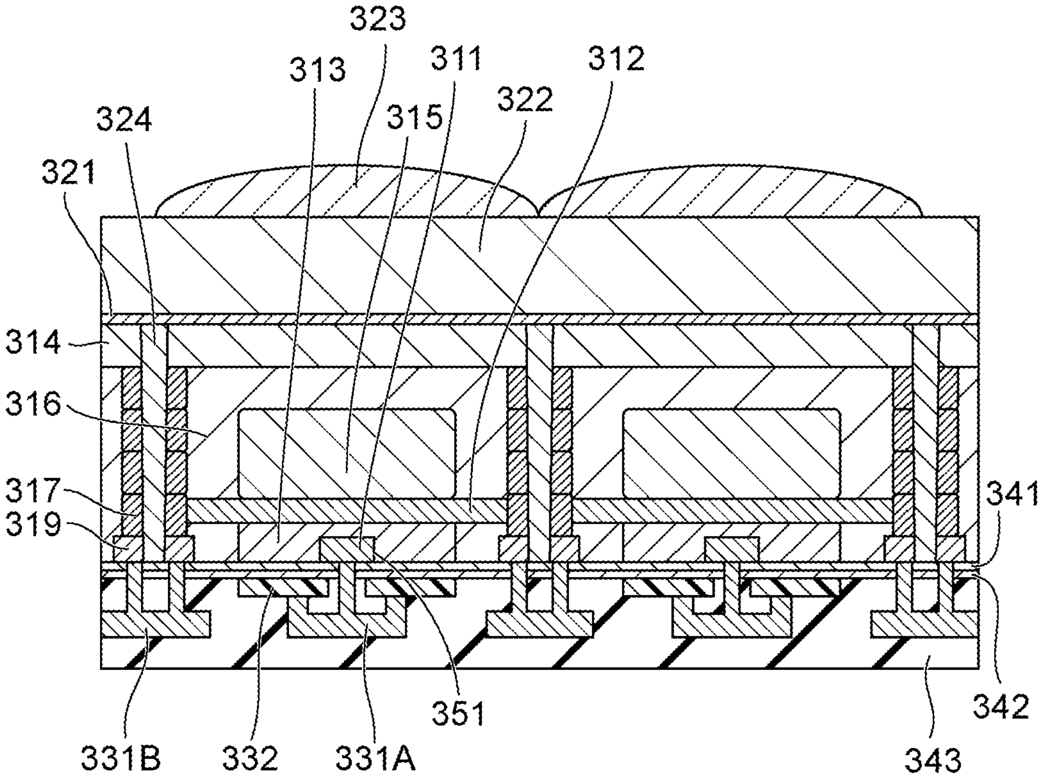
FIGS. 13A and 13B illustrate Modification 2 of the first embodiment.
Figure 13B:
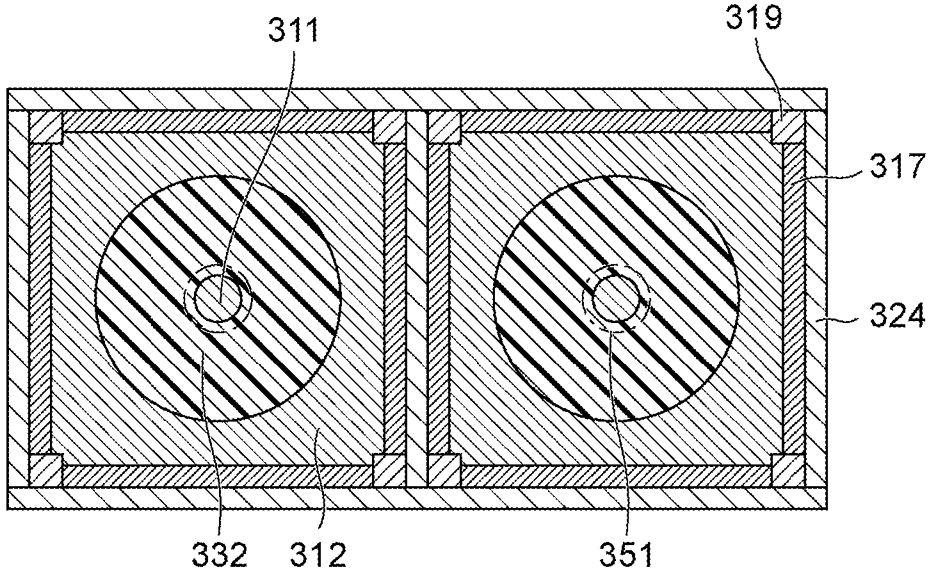

FIGS. 13A and 13B illustrate Modification 2. FIG. 13A is a cross-sectional view, and FIG. 13B is a plan view. As illustrated in FIGS. 13A and 13B, the member 332 may be formed to overlap the entire third semiconductor region 313. This configuration also can reduce carrier trapping that occurs at the interface of the entire third semiconductor region 313. As a result, a temporal change in breakdown voltage can be reduced more.

While the above description has been made with reference to an example of electrical connection of the member 332 with the cathode wiring 331A, the above-described potential gradient is generated without electrical connection of the member 332 with the cathode wiring 331 under some work function conditions of the member 332 and semiconductor region. Accordingly, a configuration in which a predetermined voltage is not applied to the member 332 may be employed.

While the above description has been made with reference to an example in which the member 332 is provided between the protective film 342 and the interlayer film 343, the member 332 may be provided between the oxide film 341 and the protective film 342. In this case, the contact that electrically connects the cathode wiring 331A to the member 332 penetrates the protective film 342. Since as described above, a predetermined voltage need not be provided to the member 332, the contact wiring is not absolutely necessary.

Second Embodiment

Figure 14:
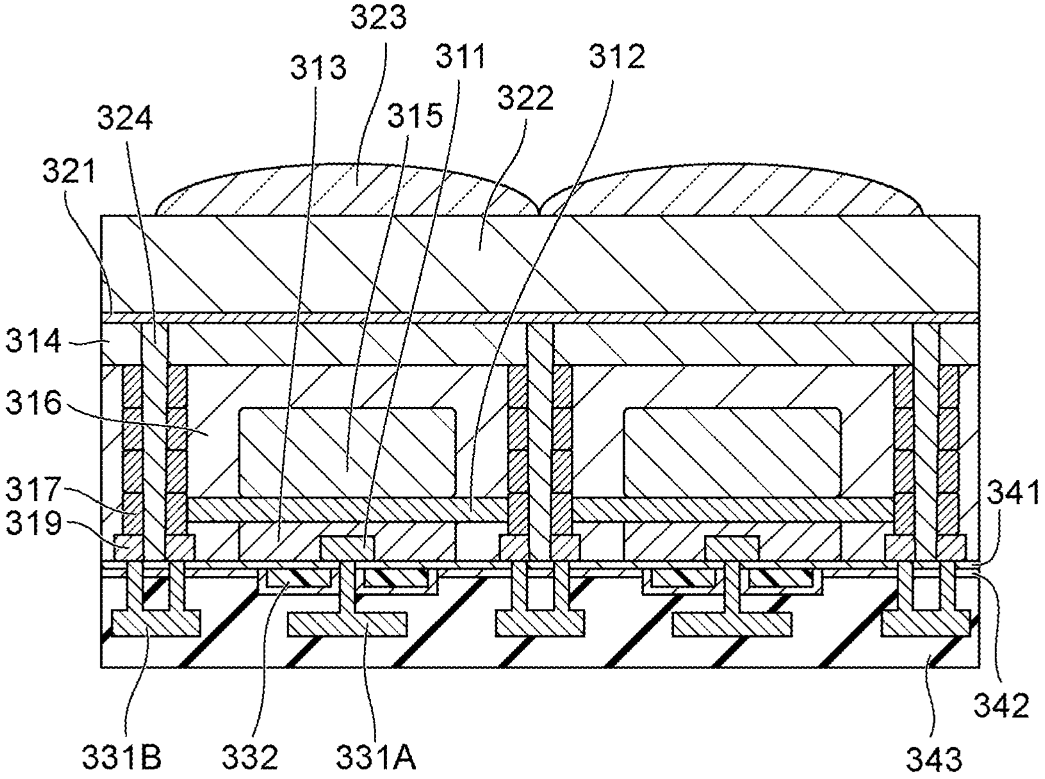
FIG. 14 is a cross-sectional view of a photoelectric conversion element according to a second embodiment.

A photoelectric conversion apparatus according to the second embodiment is described below with reference to FIG. 14. Descriptions that are the same as or similar to the descriptions of the first embodiment are not repeated, and descriptions that differ from the descriptions of the first embodiment are mainly given.

According to the present embodiment, the member 332 is formed between the oxide film 341 and the protective film 342 in cross-sectional view. In addition, in cross-sectional view, the protective film 342 is formed between two members 332. Furthermore, in plan view, the member 332 covers the boundary portion between the first semiconductor region 311 and the third semiconductor region 313. Unlike the first embodiment, the member 332 is isolated from the cathode wiring 331A and is not supplied with an electric potential.

The member 332 is made of a material that can make the interface state density between the member 332 and the oxide film 341 less than the interface state density between the oxide film 341 and the protective film 342. The interface state density is synonymous with the interface defect density. The interface state density (the interface defect density) is the density of defects caused by the incommensurability that occurs at the hetero interface of the members.

Hot carriers are trapped in the interface between the oxide film 341 and the protective film 342. This affects the potential distribution in the avalanche region in the semiconductor layer 302, and the breakdown voltage may change. Then, the hot carrier trapping can be reduced by providing the member 332 that satisfies the condition that the interface state density between the oxide film 341 and the member 332 is less than the interface state density between the oxide film 341 and the protective film 342. By forming the member 332 between the oxide film 341 and the protective film 342, the temporal change in breakdown voltage can be reduced.

In addition, like the first embodiment, a sufficient distance between the cathode wiring 331A and the anode wiring 331B can be maintained, thus reducing the breakdown voltage concerns.

Figure 15:
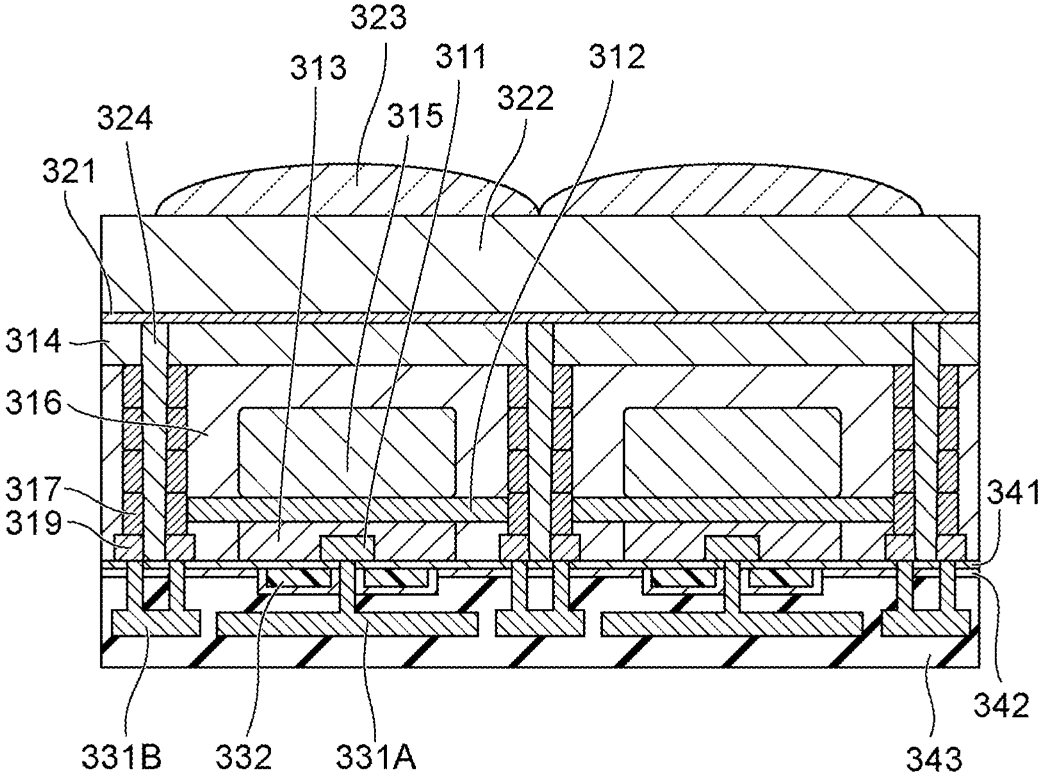
FIG. 15 illustrates a modification of the second embodiment.
Figure 16:
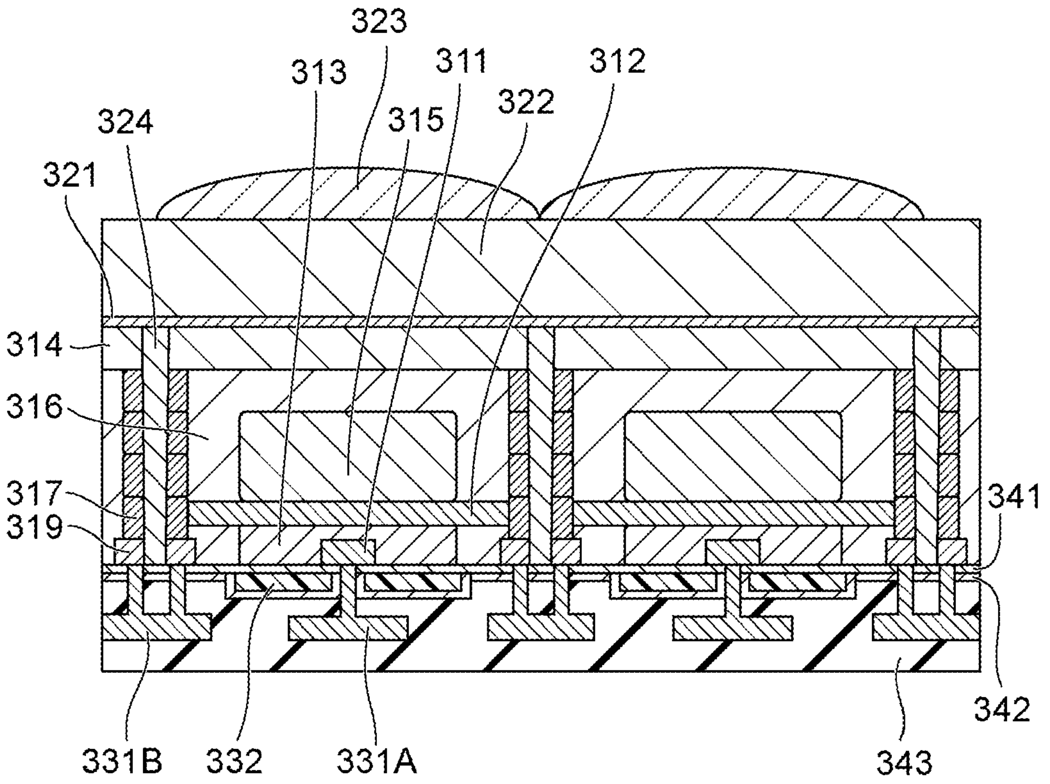
FIG. 16 is a modification of the second embodiment.

According to the present embodiment, as illustrated in FIG. 15, the cathode wiring 331A may be configured to extend toward the anode wiring 331B. In addition, as illustrated in FIG. 16, the member 332 may be formed to overlap the entire third semiconductor region 313.

Third Embodiment

A photoelectric conversion apparatus according to the present embodiment is described below with reference to FIGS. 17A and 17B. Descriptions that are the same as or similar to the descriptions of the first or second embodiment are not repeated, and descriptions that differ from the descriptions of the first embodiment are mainly given. According to the present embodiment, as illustrated in FIG. 17B, the member 332 overlaps the entire first semiconductor region 311 in plan view.

In the configuration illustrated in FIG. 6, a contact portion is disposed to electrically connect the cathode wiring 331A provided in the first wiring layer to the first semiconductor region 311. For this reason, a space is required between the contact portion and the member 332. Therefore, it may be difficult to reduce the pixel size in plan view due to the area occupied by the member 332.

Figure 17A:
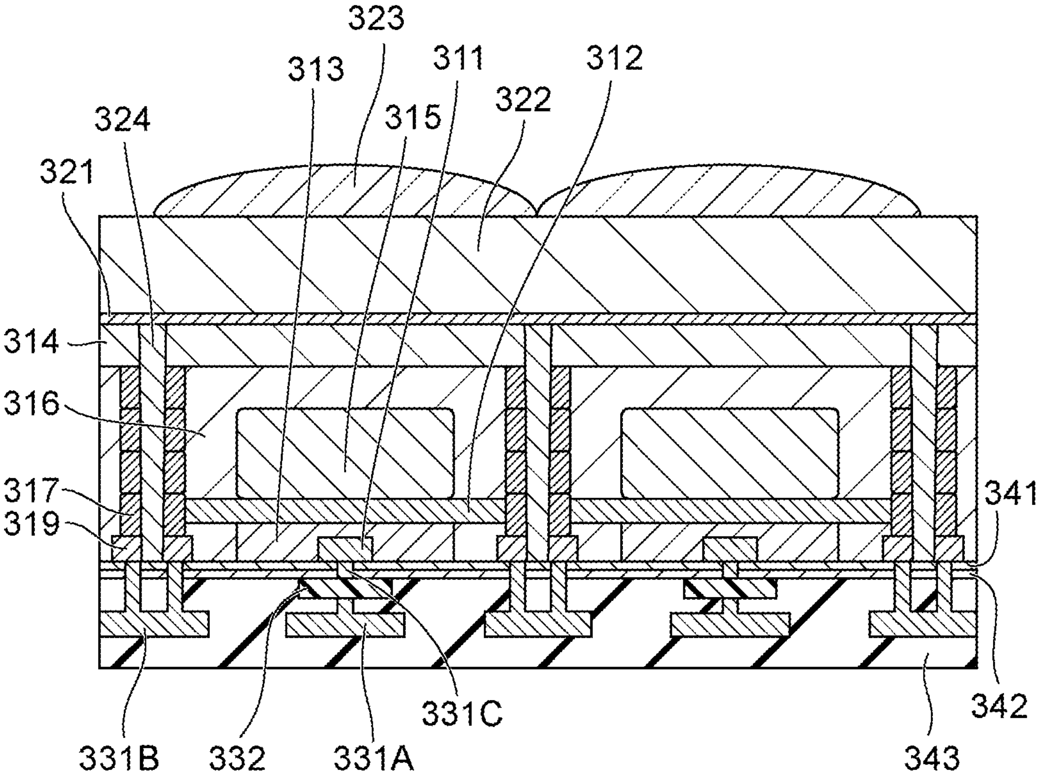
FIGS. 17A and 17B are a cross-sectional view and a plan view of a photoelectric conversion element according to a third embodiment, respectively.
Figure 17B:
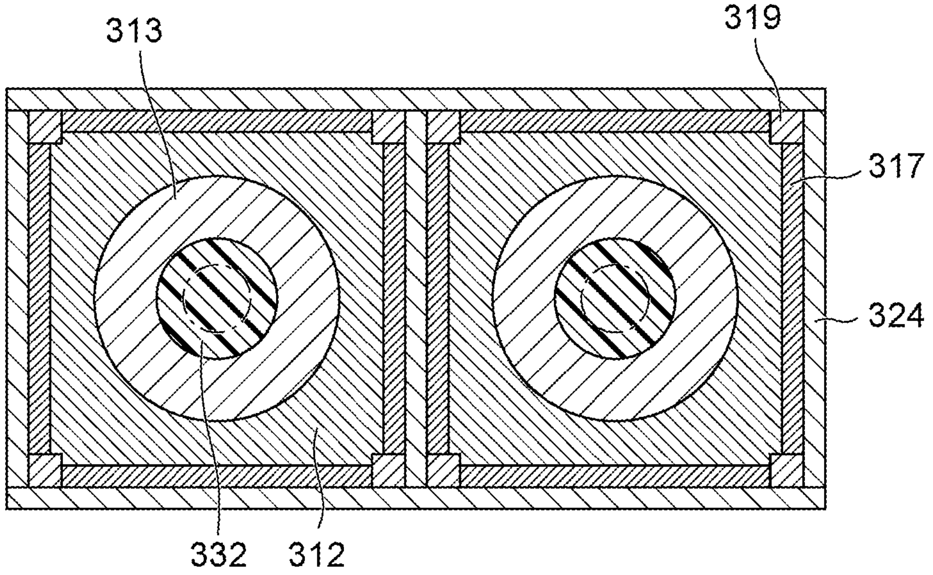

However, according to the configuration illustrated in FIGS. 17A and 17B, a contact plug 331C is provided so as to pass through the oxide film 341 and the protective film 342, and the member 332 and the first semiconductor region 311 are electrically connected via the contact plug 331C. Also, the cathode wiring 331A and the member 332 are electrically connected via a contact plug. According to the present configuration, it is not necessary to provide space between the contact plug that connects the cathode wiring 331A to the first semiconductor region 311 and the member 332 and, thus, the pixel size can be reduced.

The contact plug 331C may be made of the same material as the contact plug that electrically connects the cathode wiring 331A to the member 332. Alternatively, the contact plug 331C may be made of a different material than the member 332.

Figure 18:
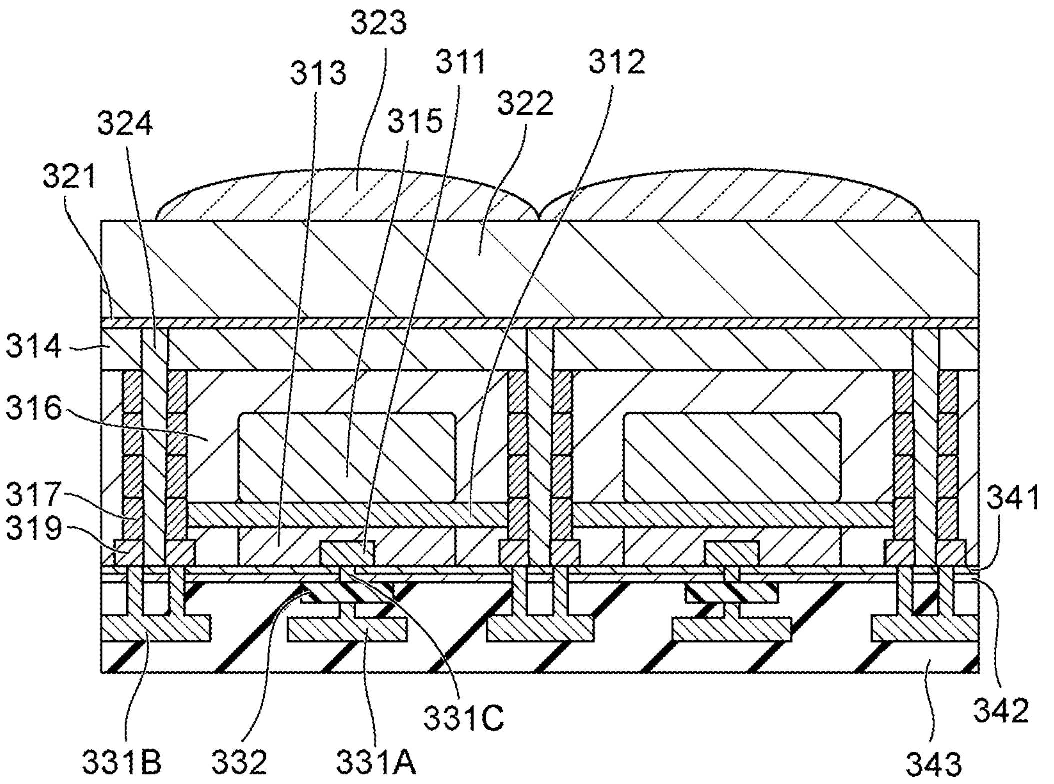
FIG. 18 illustrates a modification of the third embodiment.

However, like the configuration illustrated in FIG. 18, the contact plug 331C may be made of the same material as the member 332.

According to the configuration of the present embodiment, the pixel size can be reduced as compared with the configuration of the first embodiment. In addition, like the configuration of the first embodiment, a temporal change in breakdown voltage can be reduced. Furthermore, breakdown voltage concerns can be reduced.

Fourth Embodiment

Figure 19:
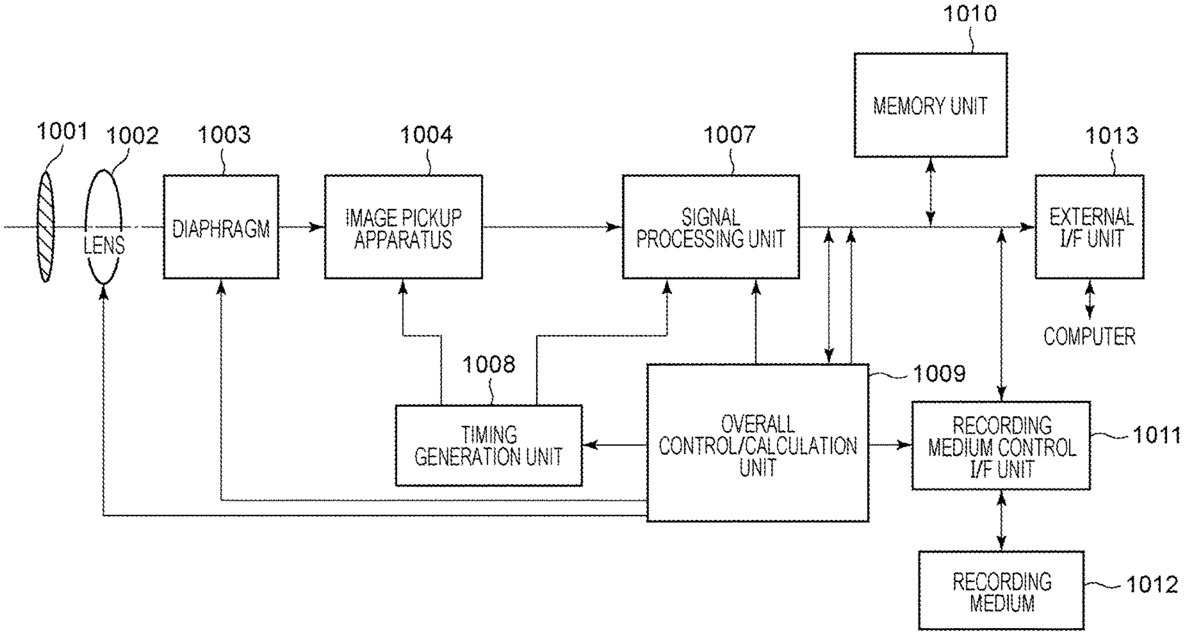
FIG. 19 is a functional block diagram of a photoelectric conversion system according to a fourth embodiment.

A photoelectric conversion system according to the present embodiment is described below with reference to FIG. 19. FIG. 19 is a block diagram of a schematic configuration of the photoelectric conversion system according to the present embodiment.

The photoelectric conversion apparatus described in each of the first to third embodiments can be applied to a variety of photoelectric conversion systems. Examples of an applicable photoelectric conversion system include a digital still camera, a digital camcorder, a surveillance camera, a copying machine, a facsimile, a mobile phone, on-vehicle camera, and an observation satellite. In addition, a camera module including an optical system, such as a lens, and an image pickup apparatus is included in the photoelectric conversion systems.

FIG. 19 is a block diagram of a digital still camera as an example of the photoelectric conversion system. The photoelectric conversion system illustrated in FIG. 19 includes an image pickup apparatus 1004 that is an example of a photoelectric conversion apparatus and a lens 1002 that forms an optical image of an object on the image pickup apparatus 1004. The photoelectric conversion system further includes a diaphragm 1003 for controlling the amount of light passing through the lens 1002 and a barrier 1001 for protecting the lens 1002. The lens 1002 and the diaphragm 1003 form an optical system for collecting light onto the image pickup apparatus 1004.

The image pickup apparatus 1004 is the photoelectric conversion apparatus according to any one of the above-described embodiments. The image pickup apparatus 1004 converts an optical image formed by the lens 1002 into an electrical signal. The photoelectric conversion system further includes a signal processing unit 1007 that serves as an image generation unit that generates an image by processing an output signal output from the image pickup apparatus 1004. The signal processing unit 1007 performs various corrections and compressions as necessary and outputs image data. The signal processing unit 1007 may be formed in a semiconductor substrate having the image pickup apparatus 1004 provided therein or may be formed in a semiconductor substrate other than the semiconductor substrate having the image pickup apparatus 1004 therein.

The photoelectric conversion system further includes a memory unit 1010 for temporarily storing image data and an external interface unit (external I/F unit) 1013 for communicating with an external computer or the like. Still furthermore, the photoelectric conversion system includes a recording medium 1012, such as a semiconductor memory, for recording and reading image data therein and therefrom, and a recording medium control interface unit (recording medium control I/F unit) 1011 for recording or reading data in and from the recording medium 1012.

The recording medium 1012 may be built in the photoelectric conversion system or may be removable. Furthermore, the photoelectric conversion system includes an overall control/calculation unit 1009 that performs control of various calculations and overall control of the digital still camera and a timing generation unit 1008 that outputs various timing signals to the image pickup apparatus 1004 and the signal processing unit 1007.

The timing signal and the like may be input from the outside, and the photoelectric conversion system can include at least the image pickup apparatus 1004 and the signal processing unit 1007 that processes the output signal output from the image pickup apparatus 1004.

The image pickup apparatus 1004 outputs an image pickup signal to the signal processing unit 1007. The signal processing unit 1007 performs predetermined signal processing on the image pickup signal output from the image pickup apparatus 1004 and outputs image data. The signal processing unit 1007 generates an image using the image pickup signal. As described above, according to the present embodiment, a photoelectric conversion system that employs the photoelectric conversion apparatus (the image pickup apparatus) of any one of the above-described embodiments can be achieved.

Fifth Embodiment

Figure 20A:
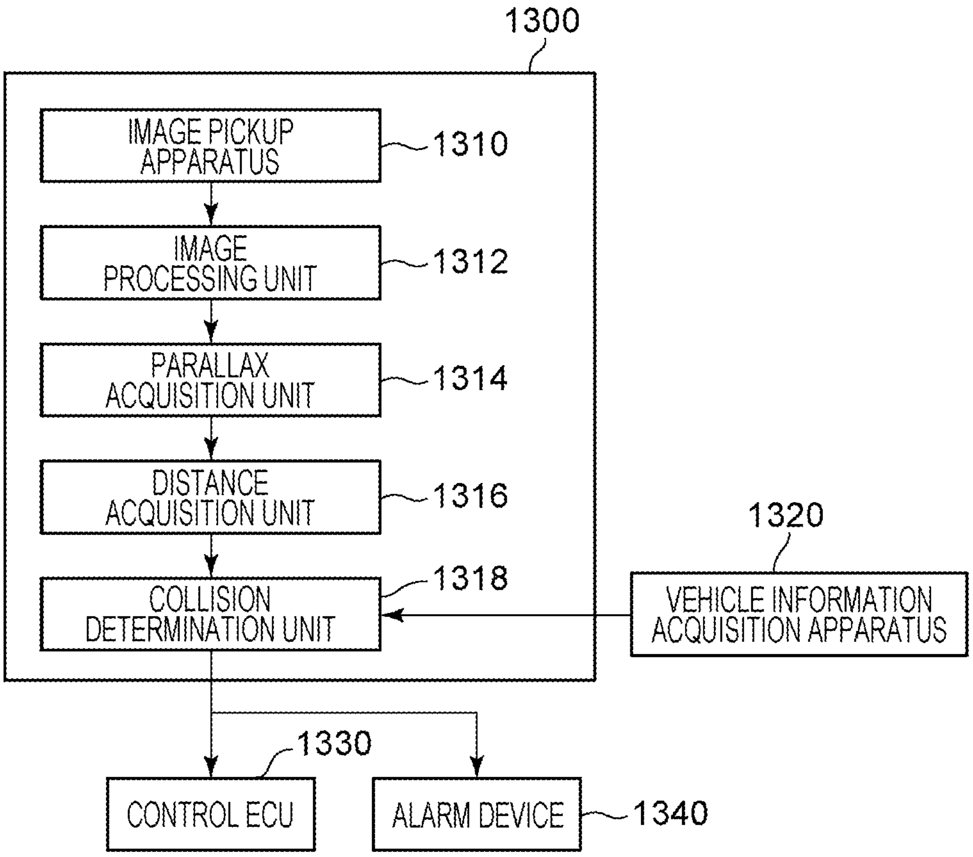
FIGS. 20A and 20B are functional block diagrams of a photoelectric conversion system according to a fifth embodiment.
Figure 20B:
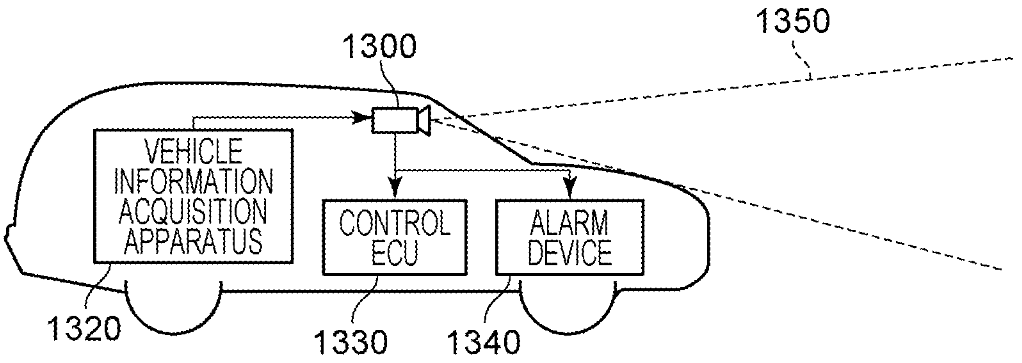

A photoelectric conversion system and a mobile object according to the present embodiment are described below with reference to FIGS. 20A and 20B. FIGS. 20A and 20B are diagrams illustrating the configurations of the photoelectric conversion system and the mobile object according to the present embodiment.

FIG. 20A illustrates an example of the photoelectric conversion system for an on-vehicle camera. A photoelectric conversion system 1300 includes an image pickup apparatus 1310. The image pickup apparatus 1310 is the photoelectric conversion apparatus described in any one of the above-described embodiments.

The photoelectric conversion system 1300 includes an image processing unit 1312 that performs image processing on a plurality of image data acquired by the image pickup apparatus 1310. Furthermore, the photoelectric conversion system 1300 includes a parallax acquisition unit 1314 that calculates a parallax (the phase difference of a parallax image) from the plurality of image data acquired by the photoelectric conversion system 1300. Still furthermore, the photoelectric conversion system 1300 further includes a distance acquisition unit 1316 that calculates the distance to the physical object on the basis of the calculated parallax and a collision determination unit 1318 that determines the collision probability on the basis of the calculated distance.

The parallax acquisition unit 1314 and the distance acquisition unit 1316 are examples of distance information acquisition units for acquiring information regarding the distance to a physical object. That is, the distance information is information related to a parallax, a defocus amount, the distance to a physical object, and the like. The collision determination unit 1318 may use any one of these pieces of distance information to determine the collision probability. The distance information acquisition unit may be implemented by dedicatedly designed hardware or may be implemented by a software module. Alternatively, the distance information acquisition unit may be implemented by a field programmable gate array (FPGA), an application specific integrated circuit (ASIC), or combinations thereof. Still alternatively, the distance acquisition unit may use a ToF range sensor, which is described in the following embodiment.

The photoelectric conversion system 1300 is connected to a vehicle information acquisition apparatus 1320. Thus, the photoelectric conversion system 1300 can acquire vehicle information, such as a vehicle speed, a yaw rate, and a steering angle. In addition, the photoelectric conversion system 1300 is connected to a control ECU 1330 which is a control unit that outputs a control signal for generating a braking force to the vehicle on the basis of the determination result of the collision determination unit 1318. Furthermore, the photoelectric conversion system 1300 is connected to an alarm device 1340 that emits an alarm to a driver on the basis of the determination result of the collision determination unit 1318. For example, if the collision determination unit 1318 determines that the collision probability is high, the control ECU 1330 performs vehicle control to avoid collisions or reduce damage by braking, releasing the accelerator pedal, or reducing the engine output. The alarm device 1340 emits an alarm to a user by, for example, sounding the alarm, displaying alarm information on a screen of a car navigation system, or vibrating a seat belt or steering wheel.

According to the present embodiment, the photoelectric conversion system 1300 captures the image of the surroundings of the vehicle, for example, the front view or rear view of the vehicle. FIG. 20B illustrates a photoelectric conversion system for capturing the image of the front view of the vehicle (an image capture range 1350). The vehicle information acquisition apparatus 1320 sends an instruction to the photoelectric conversion system 1300 or the image pickup apparatus 1310. Such a configuration can improve the accuracy of distance measurement.

While an example of performing control so as not to collide with another vehicle has been described, the configuration can also be applied to control of self-driving vehicles to follow another vehicle or control of self-driving vehicles to keep the lane. Furthermore, the photoelectric conversion system can be applied not only to a vehicle, such as an automobile, but also to a mobile object (a moving apparatus), such as a boat, an aircraft, or an industrial robot. Still furthermore, the photoelectric conversion system can be applied not only to a mobile object but also to equipment that uses object recognition over a wide area, such as an intelligent transportation system (ITS).

Sixth Embodiment

Figure 21:
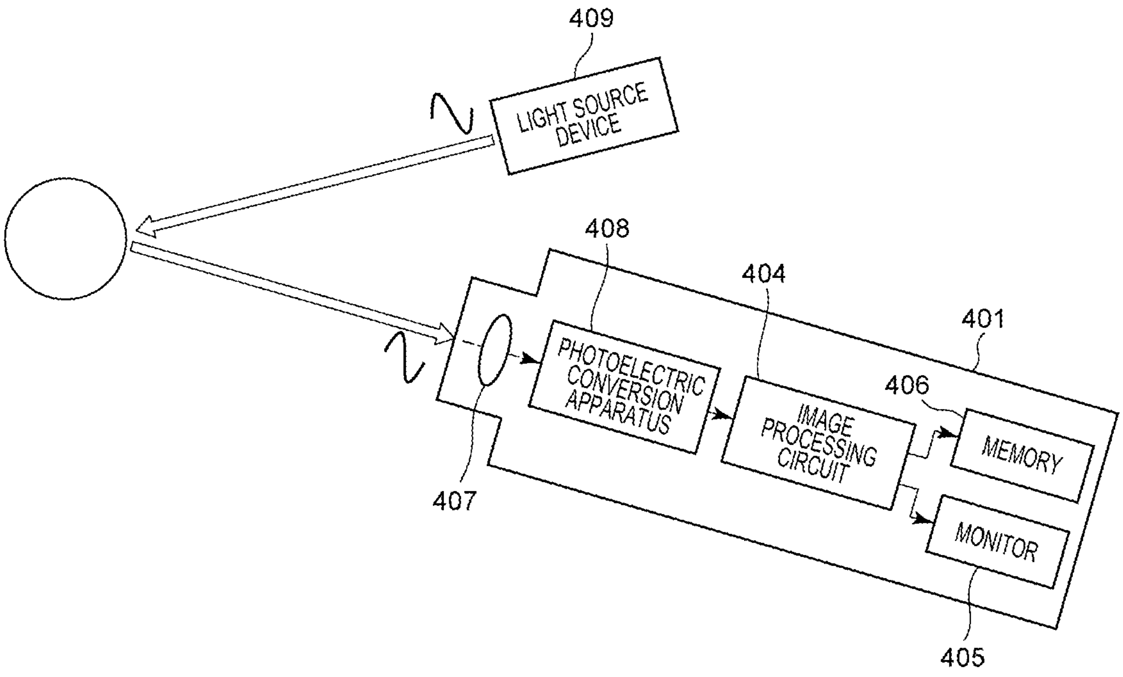
FIG. 21 is a functional block diagram of a photoelectric conversion system according to a sixth embodiment.

A photoelectric conversion system according to the present embodiment is described with reference to FIG. 21. FIG. 21 is a block diagram of a configuration example of a range image sensor, which is the photoelectric conversion system according to the present embodiment.

As illustrated in FIG. 21, a range image sensor 401 includes an optical system 407, a photoelectric conversion apparatus 408, an image processing circuit 404, a monitor 405, and a memory 406. The range image sensor 401 receives light (modulated light or pulsed light) projected from the light source device 409 toward an object and reflected by the surface of the object and, thus, can obtain a range image in accordance with the distance to the object based on the time period from light emission to light reception.

The optical system 407 includes one or more lenses. The optical system 407 guides image light (incident light) from the object to the photoelectric conversion apparatus 408 and forms an image on the light receiving surface (a sensor unit) of the photoelectric conversion apparatus 408.

As the photoelectric conversion apparatus 408, the photoelectric conversion apparatus of any one of the embodiments described above is applied, and a distance signal indicating the distance obtained from the received light signal output from the photoelectric conversion apparatus 408 is supplied to the image processing circuit 404.

The image processing circuit 404 performs image processing to construct a range image based on the distance signal supplied from the photoelectric conversion apparatus 408. The range image (image data) obtained through the image processing is supplied to the monitor 405 and is displayed. In addition, the range image is supplied to the memory 406 and is stored (recorded).

In the range image sensor 401 configured in this way, by applying the above-described photoelectric conversion apparatus, it is possible to obtain, for example, a more accurate range image in accordance with improvement of the characteristics of the pixels. The photoelectric conversion system may also be a system that outputs the results of calculations using distance information, but not the image information used in the calculations. The photoelectric conversion system may set a predetermined exposure time from the light emission time and acquire distance information using light reception information during the predetermined exposure time. In this case, the distance information can be acquired without using the time period information from light emission to light reception.

Seventh Embodiment

Figure 22:
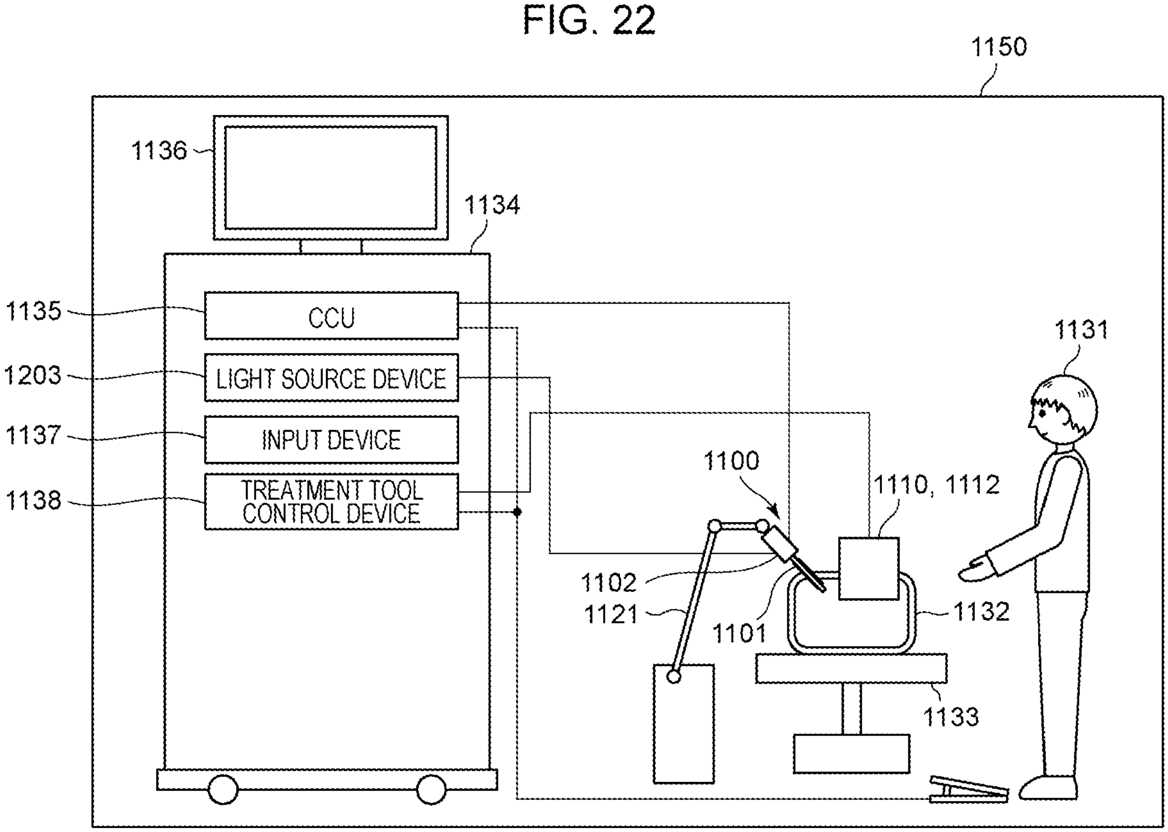
FIG. 22 is a functional block diagram of a photoelectric conversion system according to a seventh embodiment.

A photoelectric conversion system according to the present embodiment is described below with reference to FIG. 22. FIG. 22 illustrates an example of a schematic configuration of an endoscopic surgery system, which is the photoelectric conversion system according to the present embodiment.

FIG. 22 illustrates how an operator (a medical doctor) 1131 uses an endoscopic surgery system 1150 to perform surgery on a patient 1132 lying on a patient bed 1133. As illustrated in FIG. 22, the endoscopic surgery system 1150 includes an endoscope 1100, a surgical tool 1110, and a cart 1134 having a variety of devices for endoscopic surgery mounted therein.

The endoscope 1100 is composed of a lens barrel 1101, a predetermined length of the front end of which is to be inserted into the body cavity of the patient 1132, and a camera head 1102, which is connected to the base end of the lens barrel 1101. In the example of FIG. 22, the endoscope 1100 is illustrated that is configured as a so-called rigid scope having the lens barrel 1101 that is rigid. However, the endoscope 1100 may be configured as a so-called flexible scope having a lens barrel that is flexible.

An opening having an objective lens fitted thereinto is provided at the front end of the lens barrel 1101. A light source device 1203 is connected to the endoscope 1100, and light generated by the light source device 1203 is guided to the front end of the lens barrel 1101 by a light guide extending inside the lens barrel 1101. The light is emitted to an observation object in the body cavity of the patient 1132 through the objective lens. The endoscope 1100 may be a straight-viewing endoscope, an oblique-viewing endoscope, or a side-viewing endoscope.

An optical system and a photoelectric conversion apparatus are provided inside the camera head 1102, and the reflected light (observation light) from the observation object is focused on the photoelectric conversion apparatus by the optical system. The photoelectric conversion apparatus photoelectrically converts the observation light to generate an electrical signal corresponding to the observation light. That is, an image signal corresponding to the observation image is generated. As the photoelectric conversion apparatus, the photoelectric conversion apparatus described in any one of the above embodiments can be used. The image signal is transmitted to a camera control unit (CCU) 1135 in the form of RAW data.

The CCU 1135 includes a central processing unit (CPU), a graphics processing unit (GPU), and the like. The CCU 1135 comprehensively controls the operations performed by the endoscope 1100 and a display device 1136. Furthermore, the CCU 1135 receives an image signal from the camera head 1102 and performs various image processing, such as development processing (demosaicing), for displaying an image based on the image signal.

Under the control of the CCU 1135, the display device 1136 displays an image based on the image signal subjected to image processing performed by the CCU 1135.

The light source device 1203 includes a light source, such as a light emitting diode (LED), and supplies the endoscope 1100 with irradiation light for capturing the image of a surgical site or the like.

An input device 1137 is an input interface to the endoscopic surgery system 1150. A user can input a variety of information and instructions to the endoscopic surgery system 1150 via the input device 1137.

A treatment tool control device 1138 controls driving of an energy treatment tool 1112 for tissue cauterization, incision, blood vessel sealing, or the like.

The light source device 1203 that supplies irradiation light to the endoscope 1100 when the image of a surgical site is captured can include, for example, a white light source, such as an LED, a laser light source, or combinations thereof. When the white light source is configured by a combination of R, G, and B laser light sources, the output intensity and output timing of each of the colors (each of the wavelengths) can be controlled with high accuracy. Thus, white balance of a captured image can be adjusted in the light source device 1203. In this case, the observation target is irradiated with laser light from each of the R, G, and B laser light sources in a time-division manner, and driving of an image pickup element of the camera head 1102 is controlled in synchronization with the irradiation timing. In this way, an image corresponding to each of the RGB colors can be captured in a time-division manner. According to the technique, a color image can be obtained without providing a color filter on the image pickup element.

In addition, the driving of the light source device 1203 may be controlled such that the intensity of the output light is changed at predetermined time intervals. A high dynamic range without so-called crushed shadows and blown out highlights can be generated by controlling the driving of the image pickup elements of the camera head 1102 in synchronization with the timing of the change in the intensity of the light, acquiring images in a time-division manner, and combining the images.

In addition, the light source device 1203 may be configured so as to be able to supply light in a predetermined wavelength band corresponding to special light observation. In special light observation, the wavelength dependency of light absorption by a body tissue is used, for example. More specifically, a high contrast image of a predetermined tissue, such as a blood vessel on the surface of the mucous membrane, is captured by irradiating the tissue with light in a narrower band than the irradiation light used during normal observation (that is, white light).

Alternatively, in special light observation, fluorescence observation may be performed in which an image is captured using fluorescence generated by irradiation with excitation light. In fluorescence observation, a body tissue is irradiated with excitation light, and fluorescence from the body tissue can be observed. Alternatively, a reagent, such as indocyanine green (ICG), is locally injected into the body tissue, and the body tissue is irradiated with excitation light corresponding to the fluorescence wavelength of the reagent. Thus, a fluorescent image can be obtained. The light source device 1203 can be configured so as to supply narrowband light and/or excitation light corresponding to the special light observation.

Eighth Embodiment

Figure 23A:
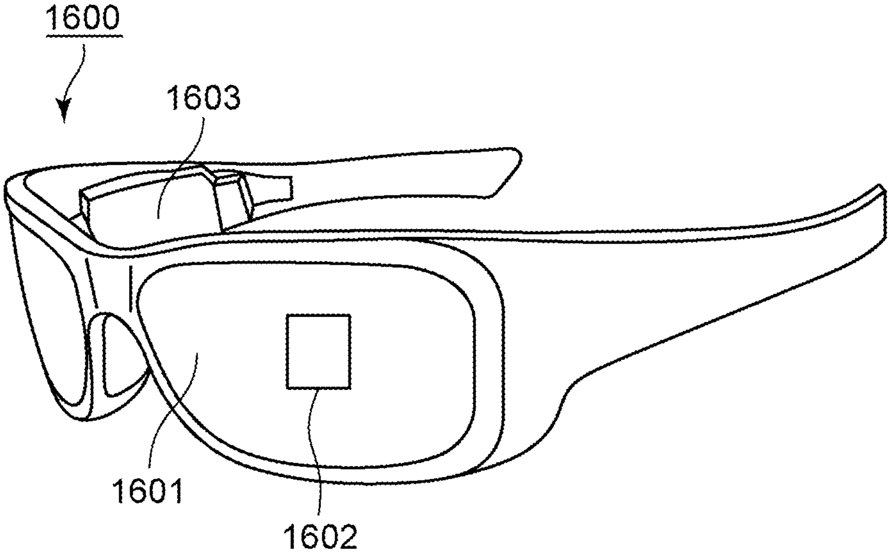
FIGS. 23A and 23B are functional block diagrams of a photoelectric conversion system according to an eighth embodiment.

A photoelectric conversion system according to the present embodiment is described below with reference to FIGS. 23A and 23B. FIG. 23A illustrates glasses 1600 (smart glasses), which are the photoelectric conversion system according to the present embodiment. The glasses 1600 include a photoelectric conversion apparatus 1602. The photoelectric conversion apparatus 1602 is the photoelectric conversion apparatus described in any one of the above embodiments. A display device including a light emitting device, such as an OLED or an LED, may be provided on the rear surface side of a lens 1601. One or more photoelectric conversion apparatuses 1602 may be provided. Furthermore, a plurality of types of photoelectric conversion apparatuses may be combined and used. The mounting location of the photoelectric conversion apparatus 1602 is not limited to that illustrated in FIG. 23A.

The glasses 1600 further include a control device 1603. The control device 1603 functions as a power source that supplies electric power to the photoelectric conversion apparatus 1602 and the display device. In addition, the control device 1603 controls the operations performed by the photoelectric conversion apparatus 1602 and the display device. The lens 1601 has an optical system formed therein to focus light onto the photoelectric conversion apparatus 1602.

Figure 23B:
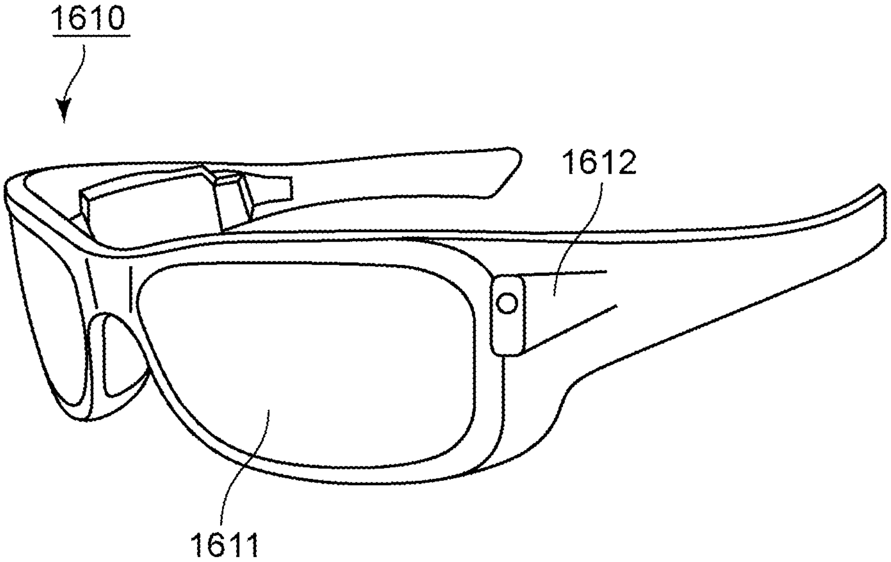

FIG. 23B illustrates glasses 1610 (smart glasses) according to an application example. The glasses 1610 include a control device 1612. The control device 1612 includes a photoelectric conversion apparatus corresponding to the photoelectric conversion apparatus 1602 and a display device. A lens 1611 includes, formed therein, the photoelectric conversion apparatus in the control device 1612 and an optical system for projecting light emitted from the display device. An image is projected to the lens 1611. The control device 1612 functions as a power source that supplies electric power to the photoelectric conversion apparatus and the display device and controls the operations performed by the photoelectric conversion apparatus and the display device. The control device may include a line-of-sight detection unit that detects the line of sight of a wearer. Infrared light may be used for line-of-sight detection. An infrared light emitting unit emits infrared light to the eyeballs of a user who is gazing at the display image. An image pickup unit including a light receiving element detects reflected light of the emitted infrared light from the eyeball and, thus, a captured image of the eyeball can be obtained. To reduce deterioration in image quality, a reduction unit is provided to reduce light from the infrared light emitting unit to a display unit in plan view.

The user's line of sight to the displayed image is detected from the captured infrared light images of the eyeball. Any known technique can be applied to line-of-sight detection using captured images of eyeballs. As an example, an eye gaze detection technique based on a Purkinje image obtained using reflection of irradiation light on the cornea.

More specifically, line-of-sight detection processing is performed on the basis of the pupillary-corneal reflection technique. The user's line of sight is detected by calculating a line of sight vector representing the orientation (the rotational angle) of the eyeball on the basis of the pupil image and the Purkinje image included in the captured eyeball image by using the pupillary-corneal reflection technique.

The display device according to the present embodiment may include a photoelectric conversion apparatus including a light receiving element and may control the display image of the display device on the basis of the user's line-of-sight information obtained from the photoelectric conversion apparatus.

More specifically, the display device determines a first field of view region that the user gazes at and a second field of view region other than the first field of view region on the basis of the line-of-sight information. The first field of view region and the second field of view region may be determined by a control unit of the display device. Alternatively, a first field of view region and a second field of view region determined by an external control device may be received. In the display area of the display device, the display resolution of the first field of view region may be controlled to be higher than the display resolution of the second field of view region. That is, the resolution of the second field of view region may be set to lower than that of the first field of view region.

Furthermore, the display area may have a first display area and a second display area different from the first display area, and a higher priority one of the first display area and the second display area may be determined on the basis of the line of sight information. The first field of view region and the second field of view region may be determined by the control unit of the display device or an external control device. Alternatively, a first field of view region and a second field of view region determined by an external control device may be received. The resolution of a high priority area may be set higher than the resolution of an area other than the high priority area. That is, the resolution of a relatively low priority area may be decreased.

Artificial intelligence (AI) may be used to determine the first field of view region and a high priority area. AI model may be a model configured to estimate the angle of the line of sight and the distance to an object in the line of sight from the eyeball image by using, as training data, eyeball images and the directions in which the eyeballs in the images are actually looking. The AI program may be stored in the display device, the photoelectric conversion apparatus, or an external device. When stored in the external device, the AI program is transmitted to the display device via communication.

In the case of display control based on visual recognition detection, the display control can be applied to smart glasses that further include a photoelectric conversion apparatus that captures the image of the outside. The smart glasses can display captured external information in real time.

The present disclosure is not limited to the above embodiments, and various modifications can be made. For example, an example in which part of the configuration of any one of the embodiments is added to another embodiment and an example in which part of the configuration of any one of the embodiments is replaced by part of another embodiment are also included in embodiments of the present disclosure.

In addition, the photoelectric conversion systems according to the fourth embodiment and the fifth embodiment are examples of photoelectric conversion systems to which the photoelectric conversion apparatus can be applied, and a photoelectric conversion system to which the photoelectric conversion apparatus according to the present disclosure can be applied is not limited to the configurations illustrated in FIG. 19 and FIGS. 20A and 20B. The same applies to the ToF system according to the sixth embodiment, the endoscope according to the seventh embodiment, and the smart glasses according to the eighth embodiment.

It should be noted that the above-described embodiments merely illustrate specific examples for carrying out the present disclosure, and the technical scope of the present disclosure should not be construed to be limited by the embodiments. That is, the present disclosure can be carried out in various forms without departing from its technical concept or main features.

The present disclosure can provide a photoelectric conversion apparatus that can reduce a temporal change in breakdown voltage due to an increase in hot carriers over time.

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-190921 filed Nov. 30, 2022, which is hereby incorporated by reference herein in its entirety.

What is claimed is:

1. A photoelectric conversion apparatus including an avalanche photodiode, the apparatus comprising:
- a semiconductor layer having a first surface in which light is incident and a second surface;
- a first semiconductor region of a first conductivity type disposed at a first depth;
- a second semiconductor region of a second conductivity type disposed at a second depth that is greater than the first depth from the second surface, wherein the second semiconductor region forms the avalanche photodiode together with the first semiconductor region;
- a third semiconductor region of the first conductivity type provided in contact with an end portion of the first semiconductor region;
- an oxide film disposed on the second surface of the semiconductor layer;
- a member provided on an opposite side of the oxide film from the semiconductor layer in cross-sectional view;
- wiring; and
- a contact plug configured to connect the wiring to the second surface of the semiconductor layer,
- wherein the member is disposed to overlap at least a boundary between the first semiconductor region and the third semiconductor region in plan view,
- wherein the member is disposed between the wiring and the semiconductor layer, and
- wherein a work function of the member differs from a work function of each of the first semiconductor region and the third semiconductor region so that a potential gradient for signal charge is formed in a depth direction of the semiconductor layer at at least the boundary, the potential gradient being formed to urge the signal charge in a direction from the member toward the first surface.

2. The photoelectric conversion apparatus according to claim 1, wherein the member is made of polysilicon of the second conductivity type.

3. The photoelectric conversion apparatus according to claim 1, wherein the first conductivity type is an N type, and
- wherein the work function of the member is greater than the work function of each of the first semiconductor region and the third semiconductor region.

4. The photoelectric conversion apparatus according to claim 3, wherein the member is made of P-type polysilicon.

5. The photoelectric conversion apparatus according to claim 1, wherein the first conductivity type is a P type, and
- wherein the work function of the member is less than the work function of each of the first semiconductor region and the third semiconductor region.

6. The photoelectric conversion apparatus according to claim 5, wherein the member is made of N-type polysilicon.

7. The photoelectric conversion apparatus according to claim 1, further comprising:
- a first wiring portion electrically connected to the first semiconductor region; and
- a second wiring portion electrically connected to the second semiconductor region,
- wherein the first wiring portion is electrically connected to the member.

8. The photoelectric conversion apparatus according to claim 1, wherein the member overlaps the entire first semiconductor region in plan view.

9. The photoelectric conversion apparatus according to claim 1, wherein the member overlaps the entire third semiconductor region in plan view.

10. The photoelectric conversion apparatus according to claim 1, further comprising:
- a protective film provided on the oxide film; and
- an interlayer film provided on the protective film,
- wherein the member is disposed between the protective film and the interlayer film.

11. A photoelectric conversion apparatus having an avalanche photodiode, the apparatus comprising:
- a semiconductor layer having a first surface in which light is incident and a second surface;
- a first semiconductor region of a first conductivity type disposed at a first depth;
- a second semiconductor region of a second conductivity type disposed at a second depth that is greater than the first depth from the second surface, wherein the second semiconductor region forms the avalanche photodiode together with the first semiconductor region;
- a third semiconductor region of the first conductivity type provided in contact with an end portion of the first semiconductor region;

an oxide film disposed on the second surface of the semiconductor layer;

a protective film disposed on an opposite side of the oxide film from the semiconductor layer, wherein the protective film is made of a material that differs from a material used for the oxide film;

an interlayer film disposed on an opposite side of the protective film from the oxide film; and a member provided between the oxide film and the protective film in cross-sectional view, wherein the member is disposed to overlap at least a boundary between the first semiconductor region and the third semiconductor region in plan view, and wherein an interface state density between the oxide film and the member is less than an interface state density between the oxide film and the protective film.

12. The photoelectric conversion apparatus according to claim 11, wherein an outer edge of the member is disposed within one pixel in plan view.

13. The photoelectric conversion apparatus according to claim 11, further comprising:

a first wiring portion electrically connected to the first semiconductor region; and a second wiring portion electrically connected to the second semiconductor region, wherein the first wiring portion is electrically connected to the member.

14. The photoelectric conversion apparatus according to claim 11, wherein the member overlaps the entire first semiconductor region in plan view.

15. The photoelectric conversion apparatus according to claim 11, wherein the member overlaps the entire third semiconductor region in plan view.

16. A photoelectric conversion apparatus including an avalanche photodiode, the apparatus comprising:

a semiconductor layer having a first surface in which light is incident and a second surface;

a first semiconductor region of a first conductivity type disposed at a first depth;

a second semiconductor region of a second conductivity type disposed at a second depth that is greater than the first depth from the second surface, wherein the second semiconductor region forms the avalanche photodiode together with the first semiconductor region;

a third semiconductor region of the first conductivity type provided in contact with an end portion of the first semiconductor region;

an oxide film disposed on the second surface of the semiconductor layer;

a member provided on an opposite side of the oxide film from the semiconductor layer in cross-sectional view;

wiring; and a contact plug configured to connect the wiring to the second surface of the semiconductor layer, wherein the member is disposed to overlap at least a boundary between the first semiconductor region and the third semiconductor region in plan view, wherein the member is disposed between the wiring and the semiconductor layer, and wherein the member is made of second conductivity type polysilicon so that a potential gradient for signal charge is formed to urge the signal charge in a direction from the member toward the first surface.

17. The photoelectric conversion apparatus according to claim 16, further comprising:

a first wiring portion electrically connected to the first semiconductor region; and a second wiring portion electrically connected to the second semiconductor region, wherein the first wiring portion is electrically connected to the member.

18. A photoelectric conversion system comprising:

the photoelectric conversion apparatus according to claim 1; and a signal processing unit configured to generate an image by using a signal output from the photoelectric conversion apparatus.

19. A mobile object comprising:

the photoelectric conversion apparatus according to claim 1; and a control unit configured to control movement of the mobile object by using a signal output from the photoelectric conversion apparatus.

* * * * *